US012696475B2

(12) United States Patent
Lin et al.

(10) Patent No.: US 12,696,475 B2
(45) Date of Patent: Jul. 28, 2026

(54) FIELD EFFECT TRANSISTOR HAVING SEGMENTED CHANNEL REGION

(71) Applicant: Taiwan Semiconductor Manufacturing Company, Ltd., Hsinchu (TW)

(72) Inventors: Wen-Yi Lin, Tainan (TW); Shi-Sheng Hu, Tainan (TW); Chao-Chi Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 525 days.

(21) Appl. No.: 18/459,025

(22) Filed: Aug. 30, 2023

(65) Prior Publication Data

US 2025/0081511 A1     Mar. 6, 2025

(51) Int. Cl.
H10D 30/62 (2025.01)
H10D 30/01 (2025.01)
(Continued)

(52) U.S. Cl.
CPC ....... H10D 30/6211 (2025.01); H10D 30/014 (2025.01); H10D 30/024 (2025.01);
(Continued)

(58) Field of Classification Search
CPC ............. H10D 30/6211; H10D 30/014; H10D 30/6757; H10D 62/121; H10D 84/853;
(Continued)

(56) References Cited

U.S. PATENT DOCUMENTS

| | | | |
|---|---|---|---|
| 11,677,004 B2 * | 6/2023 | Van Dal | H10D 30/024 257/E21.09 |
| 2017/0358648 A1 * | 12/2017 | Van Dal | H10D 30/797 |

(Continued)

FOREIGN PATENT DOCUMENTS

| | | |
|---|---|---|
| TW | I729789 B | 6/2021 |
| TW | 202209637 A | 3/2022 |

OTHER PUBLICATIONS

Notice of Allowance received in the counterpart Taiwan application 112146693, mailed on Jul. 29, 2024.

*Primary Examiner* — Christine A Enad
(74) *Attorney, Agent, or Firm* — Kilpatrick Townsend & Stockton LLP

(57) ABSTRACT

Field effect transistor (FET) devices having a heterogeneous/segmented channel region and methods for fabricating the same are provided. In one example, a fin-like field effect transistor (FinFET) device includes a substrate, a fin structure disposed on the substrate, a segmented channel region formed in the fin structure, two source/drain (S/D) regions separated by the segmented channel region, and a gate structure wrapping around the segmented channel region. The segmented channel region further includes multiple channel segments sequentially arranged in the segmented channel region, and the multiple channel segments include a first channel segment and a second channel segment. The first channel segment includes a first channel barrier material dispersed therein and has a first energy barrier, and the first energy barrier is at least 0.1 electron volts (eV) in a carrier flow path between the two S/D regions when the FinFET device is not activated for operation.

20 Claims, 16 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 84/01* | (2026.01) |
| *H10D 84/03* | (2025.01) |
| *H10D 84/85* | (2025.01) |

(52) U.S. Cl.
CPC ......... *H10D 30/43* (2025.01); *H10D 30/6735* (2025.01); *H10D 30/6757* (2025.01); *H10D 62/121* (2025.01); *H10D 62/151* (2025.01); *H10D 84/0167* (2025.01); *H10D 84/017* (2025.01); *H10D 84/0193* (2025.01); *H10D 84/038* (2025.01); *H10D 84/853* (2025.01)

(58) Field of Classification Search
CPC . H10D 84/0167; H10D 30/024; H10D 62/151
See application file for complete search history.

(56) References Cited

U.S. PATENT DOCUMENTS

| | | | | |
|---|---|---|---|---|
| 2021/0280675 A1* | 9/2021 | Afzalian | ................ | H10D 30/63 |
| 2022/0037318 A1 | 2/2022 | Huang | | |
| 2022/0181218 A1 | 6/2022 | Chu | | |
| 2023/0060454 A1* | 3/2023 | Jhan | ................... | H10D 84/0158 |
| 2024/0178308 A1* | 5/2024 | Afzalian | ............. | H10D 30/014 |
| 2024/0222375 A1* | 7/2024 | Xie | ................... | H10D 84/0193 |

* cited by examiner

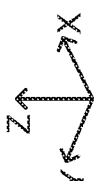
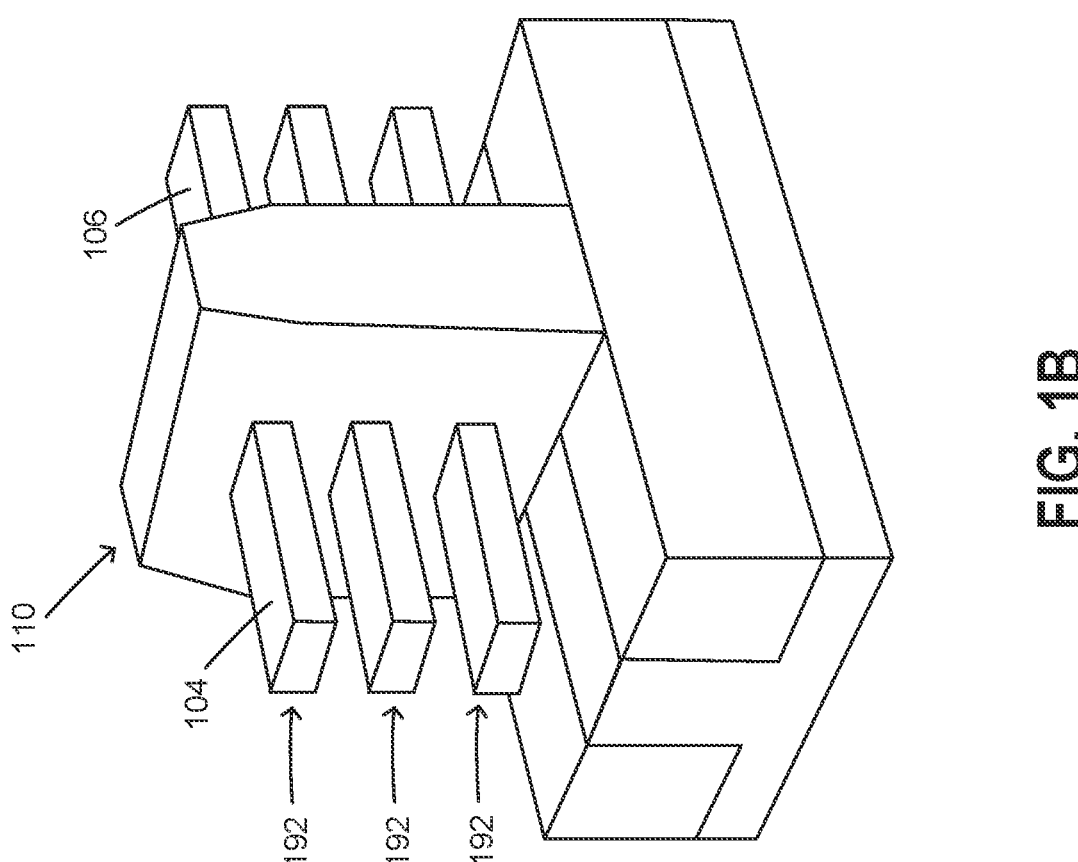
FIG. 1B

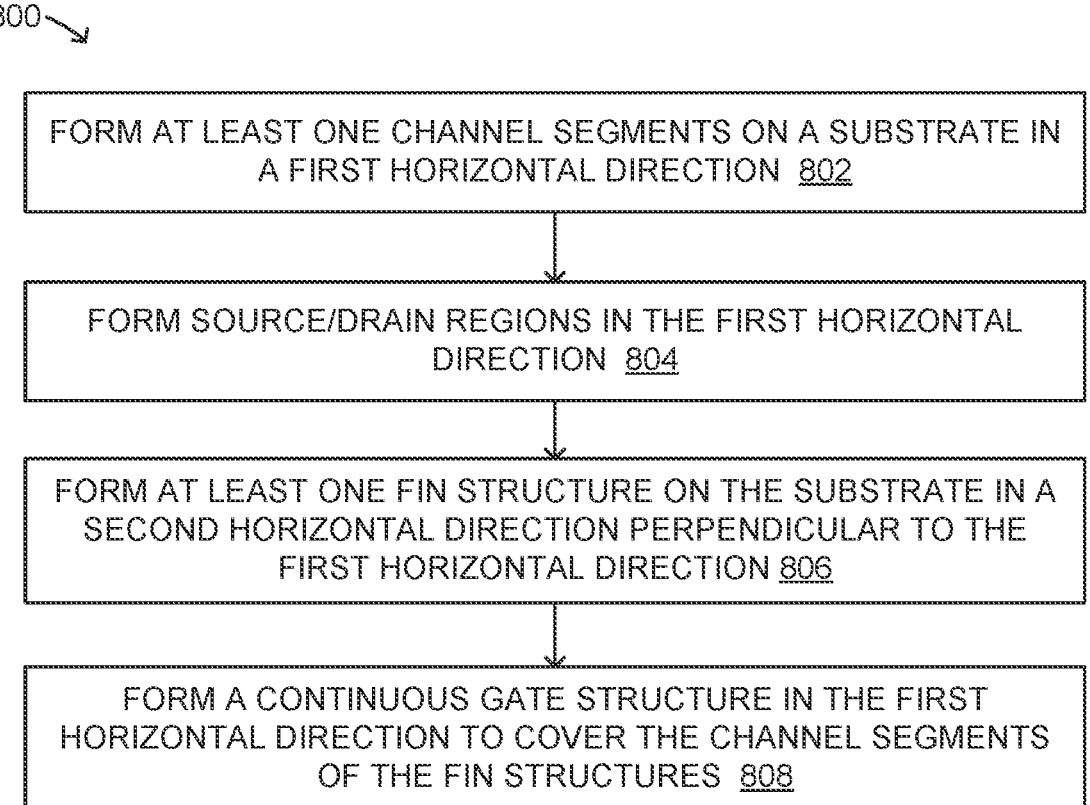

800

FORM AT LEAST ONE CHANNEL SEGMENTS ON A SUBSTRATE IN A FIRST HORIZONTAL DIRECTION  802

FORM SOURCE/DRAIN REGIONS IN THE FIRST HORIZONTAL DIRECTION  804

FORM AT LEAST ONE FIN STRUCTURE ON THE SUBSTRATE IN A SECOND HORIZONTAL DIRECTION PERPENDICULAR TO THE FIRST HORIZONTAL DIRECTION 806

FORM A CONTINUOUS GATE STRUCTURE IN THE FIRST HORIZONTAL DIRECTION TO COVER THE CHANNEL SEGMENTS OF THE FIN STRUCTURES  808

FIG. 8

FIELD EFFECT TRANSISTOR HAVING SEGMENTED CHANNEL REGION

FIELD

Embodiments of the present disclosure relate generally to semiconductor devices, and more particularly to field effect transistor (FET) devices.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device and Gate all around (GAA) nanosheet or nanowire channel field effect transistors (GAAFETs). A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a schematic diagram illustrating a perspective view of an example GAAFET device in accordance with some embodiments.

FIG. 8 is a flowchart diagram illustrating an example method for fabricating a semiconductor device in accordance with some embodiments.

DETAILED DESCRIPTION OF THE INVENTION

Figure 1A:
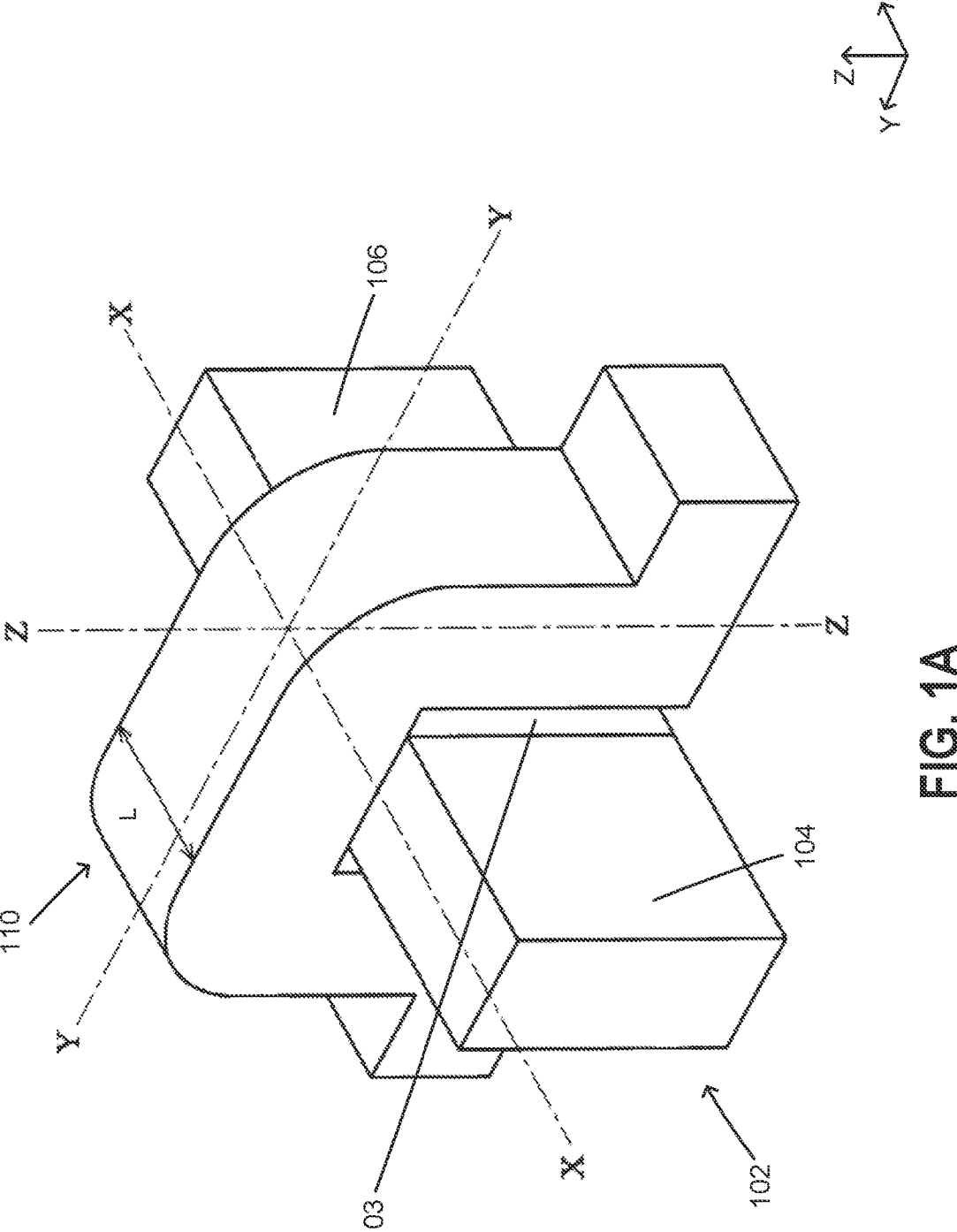
FIG. 1A is a schematic diagram illustrating a perspective view of an example FinFET device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) (also referred to and used interchangeably as "S/D regions") may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

In FinFETs, the source and the drain regions are heavily doped. The source and the drain regions each have a first semiconductor type (e.g., n-type for NMOS and p-type for PMOS). A problem with existing bulk FinFETs is that a leakage path from source to drain exists through the channel region. The leakage from source to drain through the channel region in the fin is also known as punch-through leakage.

The punch-through leakage usually occurs when there is a small, unintended current flowing through the channel region between the source and drain regions, even when the FinFET device is supposed to be in the "OFF" state. This leakage current can have several negative consequences, such as increased power consumption, reduced efficiency, and compromised performance. The punch-through leakage of FinFET devices may also contribute to standby power consumption in digital circuits or result in signal degradation and reduced voltage margins in analog circuits.

The present disclosure provides techniques to address the above-mentioned punch-through leakage problems. One insight provided in the present disclosure is related to a novel FinFET device having a segmented channel region with a channel barrier material. According to some embodiments, a FinFET device includes a fin structure and a segmented channel region formed in the fin structure. The segmented channel region includes multiple channel segments, and at least one channel segment includes a channel barrier material intended to increase the energy barrier of the channel segment.

The FinFET devices having segmented channel region with channel barrier material may provide at least the following benefits. First, introducing a channel barrier material (e.g., an epitaxial layer or a dopant having a higher work function relative to the base material of the channel) into a specific channel segment of the channel region can effectively increase the energy barrier height of the specific channel segment at the interfaces of the specific channel segment and other channel segments and/or at the interfaces of the specific channel segment and source/drain (S/D) regions. This elevated energy barrier can effectively prevent or reduce the punch-through leakage current that may occur when the FinFET device is in the "OFF" state (i.e., when the FinFET device is not activated for operation, or when the voltage across the FinFET device is below the threshold voltage (Vt) without the channel barrier material). Accordingly, the control over the ON/OFF behavior and the power efficiency of the FinFET device can be improved. This is particularly useful in applications where absolute-zero or near-absolute-zero punch-through leakage of the FinFET device is desired.

In addition, by selectively introducing the channel barrier material into only a segment of the channel region, between control over the conductive properties of the FinFET device can be achieved. The carrier concentration and mobility in specific segment of the channel region may be adjusted to enable optimization of the FinFET device performance, threshold voltage, and other electrical characteristics.

Moreover, selective inclusion of a channel barrier material in a segment of the channel region may also allow for greater design flexibility and optimization of the FinFET device provide the ability to tailor the channel properties to meet specific performance requirements and address challenges associated with device scaling. As an example, multiple FinFET devices having segmented channel region with channel barrier material may be formed in one given area during the same fabrication process, resulting in higher device integration density and improvement on overall chip functionality and packing density.

Further, the segmented channel region according to the present disclosure may be widely applicable in other types of field-effect transistor devices beyond FinFETs, including but not limited to planar-type transistor devices, silicon-on-insulator (SOI) devices, GAAFETs, high-voltage (HD) devices, Complementary Metal-Oxide-Semiconductor (CMOS) devices, Double-Diffused MOS (DMOS) devices, Bipolar-CMOS-DMOS (BCD) devices, among others.

Example FinFET Devices with Segmented Channel Region

FIG. 1A is a schematic diagram illustrating a perspective view of an example FinFET device 100A. In the illustrated example, the FinFET device 100A includes, among other components, a fin structure 102 and a gate structure 110. The fin structure 102 extends in a first horizontal direction (i.e., the X-direction) and includes two source/drain regions (hereinafter S/D regions) 104 and 106, as well as a segmented channel region 103 extending in the first horizontal direction between and connecting the two S/D regions 104 and 106. The gate structure 110 extends in a second horizontal direction (i.e., the Y-direction) and is disposed on and wraps around the segmented channel region 103. The two S/D regions 104 and 106 are formed in extensions of the fin structure 102 on opposite sides of the gate structure 110 along the first horizontal direction. The effective channel length of the FinFET device 100 is determined by the length (L) of the gate structure 110 along the first horizontal direction. It should be noted that multiple FinFET devices 100A may be arranged in a pattern such as a row, a column, or an array of rows and columns in an active region (or device region) on a substrate (not shown).

FIG. 1B is a schematic diagram illustrating a perspective view of an example GAAFET device 100B. In the illustrated example, the GAAFET device 100B includes, among other components, multiple one-dimensional (1D) linear channels 192 (sometimes also referred to as "nanosheet channels") and a gate structure 110. Similar to the fin structure 102 of the FinFET device 100A shown in FIG. 1A, the 1D linear channel 192 of the GAAFET device 100B may include two S/D regions 104 and 106 formed in extensions of the linear channel 192 on opposite sides of the gate structure 110. The 1D linear channel 192 may further include a segmented channel region (not shown) extending in the first horizontal direction between and connecting the two S/D regions 104 and 106 and wrapped around by the gate structure 110.

It should be noted the FinFET device 100A and GAAFET device 100B shown in FIGS. 1A-1B are for illustrative purposes only and not intended to be limiting. Various other microstructured or nanostructured FET devices in which the segmented channel region 103 is applicable are also within the scope of the present disclosure, such as nanosheet transistors, nanowire transistors, multi bridge channel transistors, nano-ribbon transistors, stained channel transistors, among others.

The FinFET and GAAFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET or GAAFET devices for a portion of, or the entire IC chip.

However, some FinFET and GAAFET devices may have a uniform channel profile and thus may suffer from punch-through leakage as mentioned above. Here, the various aspects of the present disclosure involve forming a FinFET device or a GAAFET device having segmented channel region or a heterogenous channel structure and consequently has a reduced or minimized punch-through leakage. FIGS. 2A-6B illustrate various examples of the FinFET devices having a segmented channel region. For purposes of clarity, three-dimensional axes X, Y, and Z are shown in FIG. 1A to correspond to the axes in FIGS. 2A-6B. The X, Y, and Z axes may also be referred to as the X, Y, and Z directions, respectively.

Figure 2A:
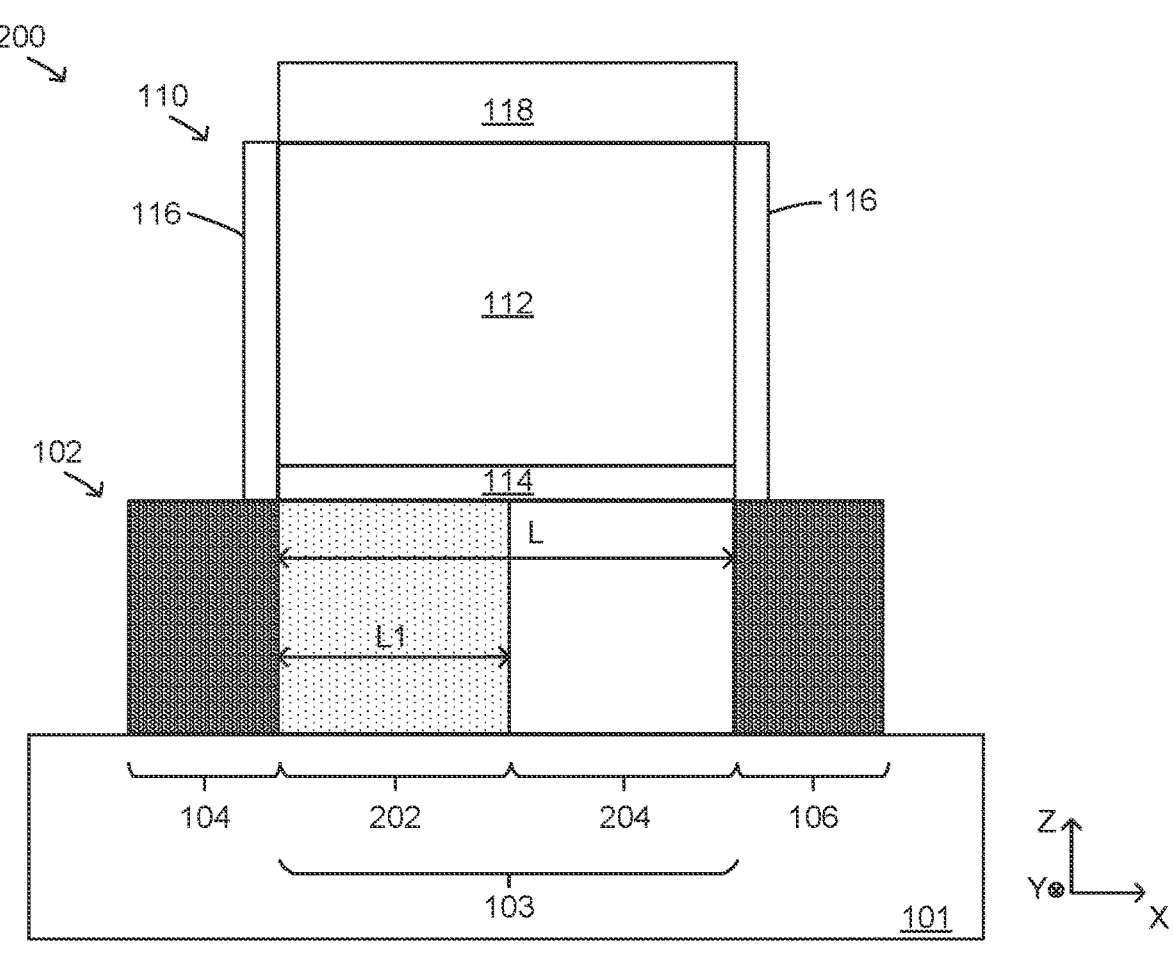
FIG. 2A is schematic diagram illustrating a cross-sectional view of an example FinFET device along a first horizontal direction in accordance with some embodiments.
Figure 2B:
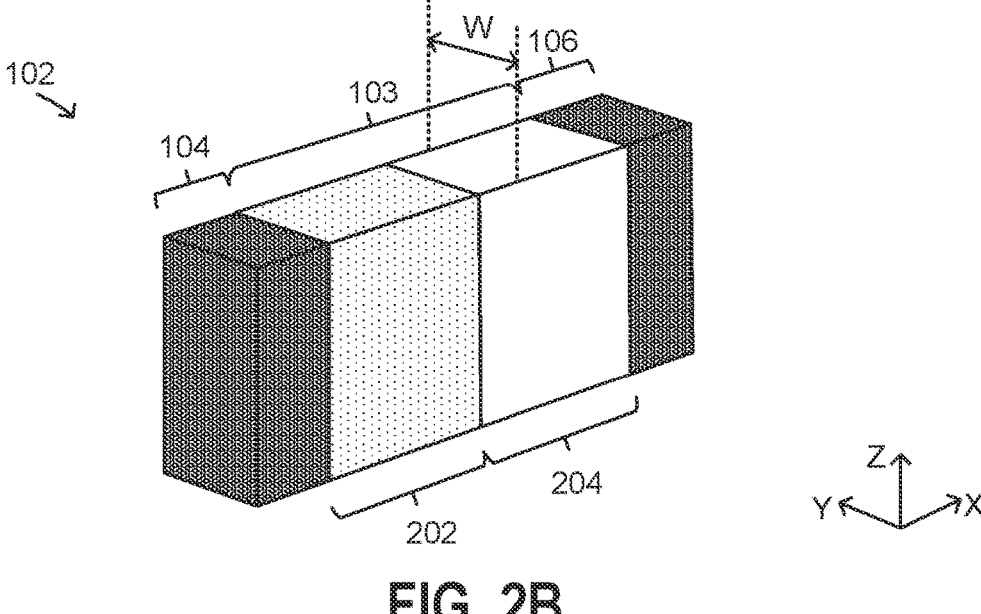
FIG. 2B is a schematic diagram illustrating a perspective view of an example fin structure shown in FIG. 2A in accordance with some embodiments.

FIGS. 2A-2B illustrate an example FinFET device 200. FIG. 2A is schematic diagram illustrating a cross-sectional view of the FinFET device 200 along the first horizontal direction. FIG. 2B is a perspective view of the fin structure 102 of the FinFET device 200 shown in FIG. 2A. In the illustrated example, the FinFET device 200 includes a substrate 101, a fin structure 102, and a gate structure 110. The substrate 101 may be a silicon substrate. Alternatively, the substrate 101 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 101 is a semiconductor on insulator (SOI).

As mentioned above, the fin structure 102 extends in a first horizontal direction and includes two S/D regions 104 and 106 respective at two end portions of the fin structure 102, as well as a segmented channel region 103 disposed between and connecting the two S/D regions 104 and 106. The gate structure 110 is disposed on and wraps around the segmented channel region 103 (i.e., covering the top surface and sidewalls of the segmented channel region 103). The gate structure 110 further includes a gate electrode layer 112, a gate dielectric layer 114, two gate spacers 116, and a hard mask layer 118.

The gate dielectric layer 114 is formed on and wraps around the segmented channel region 103 of fin structure 102, and the gate electrode layer 112 is formed on the gate dielectric layer 114. The gate dielectric layer 114 and the gate electrode layer 112 may each be formed using a deposition process known in the art, for example chemical vapor deposition (CVD), physical vapor deposition (PVD), atomic layer deposition (ALD), combinations thereof, or another suitable process. In some embodiments, the gate dielectric layer 114 includes a hafnium oxide ($HfO_2$) material and has a thickness (measured in the Z direction) that is in a range from about 1 nm to about 5 nm. In some embodiments, the gate electrode layer 112 includes a titanium nitride (TiN) material and has a thickness (measured in the Z direction) that is in a range from about 1 nm to about 50 nm.

The gate spacers 116 are formed around the long sides of gate structure 110. In other words, the gate spacers 116 extend in an elongate manner along the Y-direction. The gate spacers 116 are formed by depositing a spacer material over the gate structure 110 and thereafter performing a patterning and etching process on the spacer material. The gate spacers 116 may include a dielectric material. In some embodiment, the gate spacers 116 include silicon oxide or silicon nitride. The gate spacers 116 each have a width in the X direction from about 1 nm to about 20 nm. The hard mask layer 118 is used to pattern, such as by etching, the gate structure 110. In some embodiments, the hard mask layer 118 is made of a dielectric material, such as silicon oxide.

The segmented channel region 103 may have a channel length (L) substantially the same as the length (L) of the gate structure 110 along the first horizontal direction. In some embodiments, the channel length (L) is from about 5 nm to about 50 nm in the first horizontal direction. In some embodiments, the channel length (L) is from 5 nm to 45 nm, from 5 nm to 35 nm, from 5 nm to 25 nm, from 5 nm to 15 nm, or from 5 nm to 15 nm. In addition, the fin structure 102 has a width (W) in a second horizontal direction perpendicular to the first horizontal direction (i.e., the Y-direction).

The segmented channel region 103 may include a base semiconductor material such as Si, Ge, SiGe, or a III-V compound semiconductor material such as gallium arsenide (GaAs) and indium phosphide (InP). In one embodiment, the segmented channel region 103 includes Si as the base semiconductor material.

The segmented channel region 103 further includes a plurality of channel segments including a first channel segment 202 and a second channel segment 204. The channel segments use herein are also referred to and used interchangeably with "channel sub-regions." The channel segments 202 and 204 may be arranged in the first horizontal direction. In the illustrated example, the channel segments 202 and 204 are adjacent to each other. However, the channel segments 202 and 204 may be separated from each other along the first horizontal direction. In the illustrated example, the channel segments 202 and 204 are respectively connected to the two S/D regions 104 and 106. However, the channel segments 202/204 may be separated from the S/D regions 104/106 by another channel segment disposed therebetween in alternative embodiments.

The channel segments 202 and 204 have different material compositions. In some embodiments, the channel segments 202 and 204 include different dopants (e.g., different doping elements or dopants of different semiconductor type). In some embodiments, the channel segments 202 and 204 have different doping concentrations. In some embodiments, the channel segments 202 and 204 include different materials (e.g., epitaxial layers). In some embodiments, the channel segments 202 and 204 include the same material but with different crystal structures or crystallographic orientations of a crystal lattice (e.g., crystal orientations 110 or 111) Accordingly, the segmented channel region 103 is heterogeneous in nature. In other words, the FinFET device 200 has a heterogenous channel structure.

In some embodiments, at least one of the channel segments 202 and 204 includes a channel barrier material intended to increase barrier property of the channel region 103. The term "channel barrier material" used herein refers to any dopant or material introduced into the channel region to modify its electrical properties, enhance the barrier effect, increase the threshold voltage (Vt) of the FinFET device, and reduce the punch-through leakage effect of the FinFET device. Examples of the channel barrier material includes but are not limited to barrier dopants such as Boron (B), Indium (In), Gallium (Ga), Phosphorous (P), Arsenic (As), Antimony (Sb); alloyed materials such as Silicon-Germanium (SiGe), Silicon-Germanium-Carbon (SiGeC), Indium Gallium Arsenide (InGaAs); dielectric materials such as Silicon Oxide ($SiO_2$), Hafnium Dioxide ($HfO_2$) or Aluminum Oxide ($Al_2O_3$); metal compound materials such as tantalum nitride (TaN), titanium nitride (TiN), or hafnium-silicate (HfSiO), and so on. Additional examples of the channel barrier materials include $Ga_2O_3$, $TiO_2$, InP, GaAs, GaP, CdSe, TaON, $WO_3$, $ZrO_2$, ZnS, SiC, $SrTiO_3$, etc, depending on the semiconductor type (e.g., n-type or p-type) of the FinFET.

It should be noted that although some dopants such as B, In, Ga, P, As, and Sb are also commonly used in normal channel regions to increase the carrier flow of the channel, they can also be used as channel barrier dopant when introduced in a certain segment or local region of the channel region (e.g., the channel segment 202) with a substantially higher doping concentration therein to modify the electrical properties and enhance the barrier effect of the channel segment as well as the entire channel region. In other words, the concentration profile of a certain dopant may vary across the channel region in the first horizontal direction.

In some embodiments, the channel barrier material is in a form of a dopant (i.e., the channel barrier dopant). The channel barrier dopant has the same semiconductor type as the S/D regions 104 and 106 (e.g., p-type or n-type). In some embodiments, the channel barrier dopant has the opposite semiconductor type as the S/D regions 104 and 106. In some embodiments, the channel barrier dopant is the same as the dopant in the S/D regions.

In some embodiments, the channel region has a base semiconductor material of Si, and the channel barrier material included in a specific channel segment (e.g., the first or the second channel segment 202 or 204) is SiGe, and the concentration of Ge is at least 5% by weight of the SiGe in the specific channel segment. In some embodiments, the channel barrier material is an epitaxially grown layer of SiGe in the specific channel segment. In some embodiments, the Ge is a channel barrier dopant distributed or dispersed in the specific channel segment with a concentration of at 5% by weight in the specific channel segment. In some embodiments, the concentration of Ge is from 5% to 40% by weight in the specific channel segment.

In some embodiments, the channel barrier material has a work function at least 0.1 electron volts (eV) compared with the base material of the channel (e.g., Si). In some embodiments, the channel barrier material has a work function higher than the work function of the base material of the channel (e.g., Si) by at least 0.1 eV, at least 0.2 eV, at least 0.3 eV, at least 0.4 eV, or at least 0.5 eV. In some embodiments, channel barrier material has a work function higher than the work function of the base material of the channel by 0.1 eV to 1.0 eV, 0.1 eV to 0.8 eV, 0.1 eV to 0.6 eV, 0.1 eV to 0.4 eV, or 0.1 eV to 0.2 eV.

In some embodiments, the channel barrier material may be introduced to the at least one of the channel segments (e.g., the channel segment 202) by an epitaxial growth process, and the channel segment 202 may be composed of the channel barrier material. In alternative embodiments, a channel barrier dopant may be introduced to the at least one of the channel segments (e.g., the channel segment 202) by an ion implantation process, and the channel segment 202 includes the channel barrier material as a channel barrier dopant distributed or dispersed in the channel base material (e.g., silicon).

Although both epitaxial growth and implantation may be used to introduce the channel barrier materials into certain channel segments, they may have their own advantageous aspects. As an example, epitaxial growth may allow for a more uniform and controlled doping profile throughout the channel segment. During epitaxial growth, the channel barrier material is deposited layer by layer, resulting in a well-defined doping concentration. Epitaxial growth may also minimize crystal damage in the channel segment since the deposited material matches the crystal structure of the substrate. Thus, epitaxially grown channel barrier materials introduced in the channel segment may exhibit improved electrical properties, at least in part because the crystal quality and interface between the epitaxial layer and the substrate are typically of higher quality. Epitaxial growth may also enable precise control over the doping concentration and depth of the channel barrier material.

As a comparison, implantation introduces dopants through ion bombardment, which may lead to non-uniform doping and potential damages to the crystal lattice of the doped region. However, implantation may enable more flexibility in doping profiles and doping concentration by adjusting implantation energy and dose to achieve precise control over the dopant distribution.

In some embodiments, the first and second channel segments 202 and 204 may each have a length (L1) from about 1 nm to 50 nm, from 1 nm to 45 nm, from 1 nm to 35 nm, from 1 nm to 25 nm, from 1 nm to 20 nm, from 1 nm to 15 nm, from 1 nm to 10 nm, from 1 nm to 5 nm, or from 1 nm to 3 nm. In some embodiments, the channel segment length (L1) is from 1% to 99%, from 1% to 90%, from 1% to 75%, from 1% to 50%, from 1% to 40%, from 1% to 30%, from 1% to 20%, from 1% to 10%, or from 1% to 5%, of the channel length (L) of the entire channel region 103. In some embodiments, the total length of the channel region 103 including a channel barrier material is from about 1 nm to 50 nm, from 1 nm to 45 nm, from 1 nm to 35 nm, from 1 nm to 25 nm, from 1 nm to 20 nm, from 1 nm to 15 nm, from 1 nm to 10 nm, from 1 nm to 5 nm, or from 1 nm to 3 nm. In some embodiments, the total length of the channel region including a channel barrier material is from 1% to 99%, from 1% to 90%, from 1% to 75%, from 1% to 50%, from 1% to 40%, from 1% to 30%, from 1% to 20%, from 1% to 10%, or from 1% to 5%, of the channel length (L) of the entire channel region 103.

In some embodiments, the first channel segment 202 includes a channel barrier material, and second channel segment 204 is free or substantially free from a channel barrier material. For example, the first channel segment 202 may be an epitaxial layer composed of $SiO_2$ as the channel barrier material, and the second channel segment 204 may be substantially free from $SiO_2$.

In some embodiments, the first channel segment 202 has an energy barrier height of least 0.1 electron volts (eV) in a carrier flow path between the two S/D regions 104 and 106 when the FinFET device is not activated for operation. The term "energy barrier height" used herein refers to the energy difference between two adjacent/neighboring channel interfaces or between one of the two S/D regions and an adjacent/neighboring channel segment connected thereto in a FinFET device. Energy barrier height generally represents the energy barrier that carriers (electrons or holes) must overcome to move from one channel segment to another in the channel region or from an S/D region to the neighboring channel segment. In some embodiments, the first channel segment 202 has an energy barrier height of at least 0.1 eV, at least 0.2 eV, at least 0.3 eV, at least 0.4 eV, or at least 0.5 eV. In some embodiments, the first channel segment 202 has an energy barrier height of 0.1 eV to 1.0 eV, 0.2 eV to 0.8 eV, or 0.3 eV to 0.6 eV.

In some embodiments, the segmented channel region 103 includes Si as the base semiconductor material, the first channel segment 202 includes a channel barrier material, and second channel segment 204 is free or substantially free from a channel barrier material. For example, the first channel segment 202 may be an epitaxial layer composed of SiGe as the channel barrier material, and the second channel segment 204 may be substantially free from SiGe. In some embodiments, the content of Ge in the SiGe included in the first channel segment 202 is 5% to 40%. Without wishing to be bound to any particular theory, it is believed that the crystal lattice of GeSi can establish an energy barrier in the carrier flow path in the channel region, alter the carrier concentration and mobility within the channel region, and thereby reduce or prevent the punch-through leakage.

In some embodiments, the first channel segment 202 and the second channel segment 204 both include a channel barrier material. In some embodiments, the first channel segment 202 and the second channel segment 204 include different channel barrier materials. The first channel segment 202 has a first doping concentration of the channel barrier material/dopant), the second channel segment 204 has a second doping concentration of the channel barrier material/dopant, and the first doping concentration is higher than the second doping concentration by at least 1 order (i.e., 10 times). In some embodiments, the first doping concentration is higher than the second doping concentration by 2 orders to 20 orders (i.e., $10^2$-$10^{20}$ times). In some embodiments, the doping concentration of the channel barrier material/dopant in the channel segments 202 and 204 are from $10^2$ to $10^{20}$ atoms/cm$^3$, from $10^{10}$ to $10^{20}$ atoms/cm$^3$, from $10^{15}$ to $10^{20}$ atoms/cm$^3$, or from $10^{18}$ to $10^{20}$ atoms/cm$^3$.

In some embodiments, the first channel segment 202 has a first energy barrier height, the second channel segment 204 has a second energy barrier height, and the first energy barrier height is higher second energy barrier height by at least 0.1 eV, at least 0.2 eV, or at least 0.3 eV. In some embodiments, the first energy barrier height is higher second energy barrier height by 0.1 eV to 1.0 eV, 0.2 eV to 0.8 eV, or 0.3 eV to 0.6 eV. In some embodiments, the first energy barrier height is at least one time higher second energy barrier height. In some embodiments, the first energy barrier height is higher second energy barrier height by 1 to 5 times.

Figure 3A:
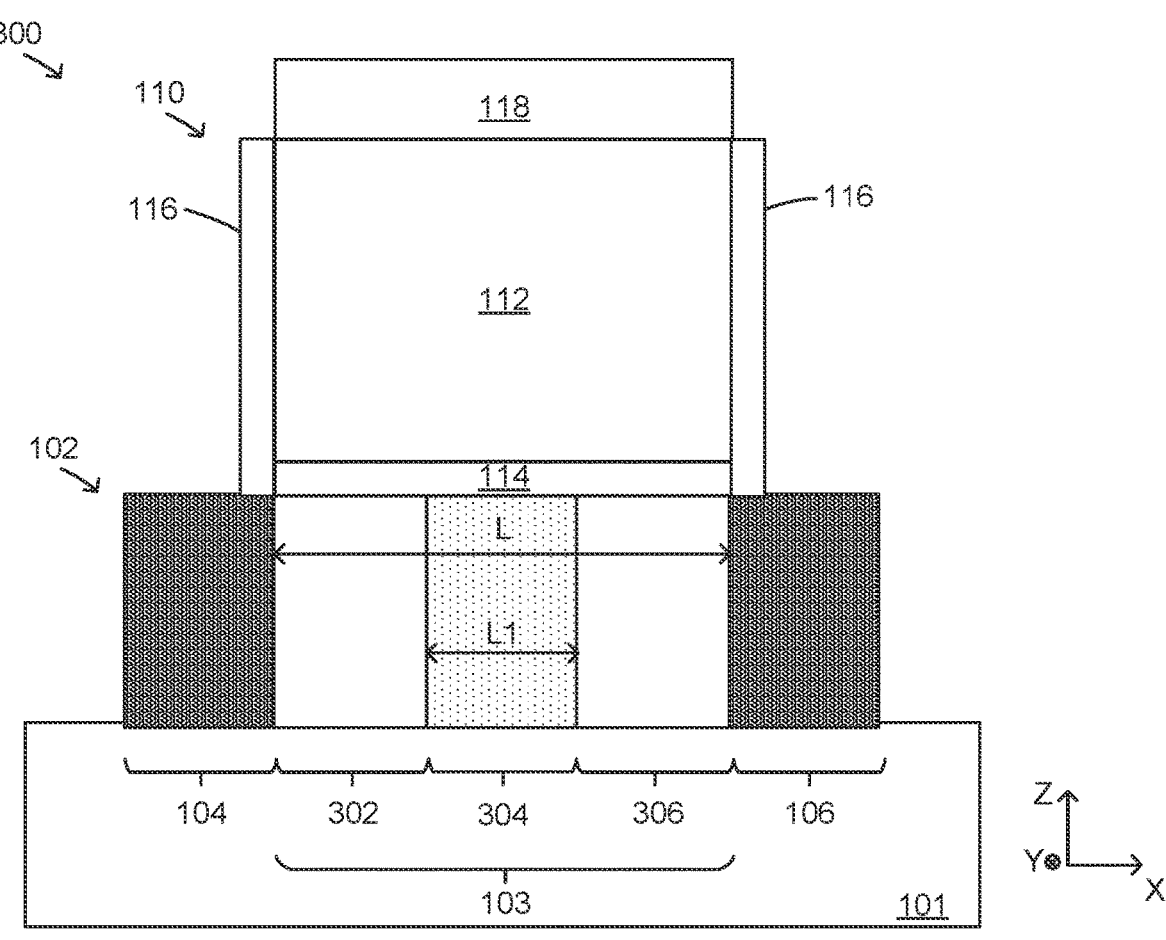
FIG. 3A is schematic diagram illustrating a cross-sectional view of another example FinFET device along a first horizontal direction in accordance with some embodiments.
Figure 3B:
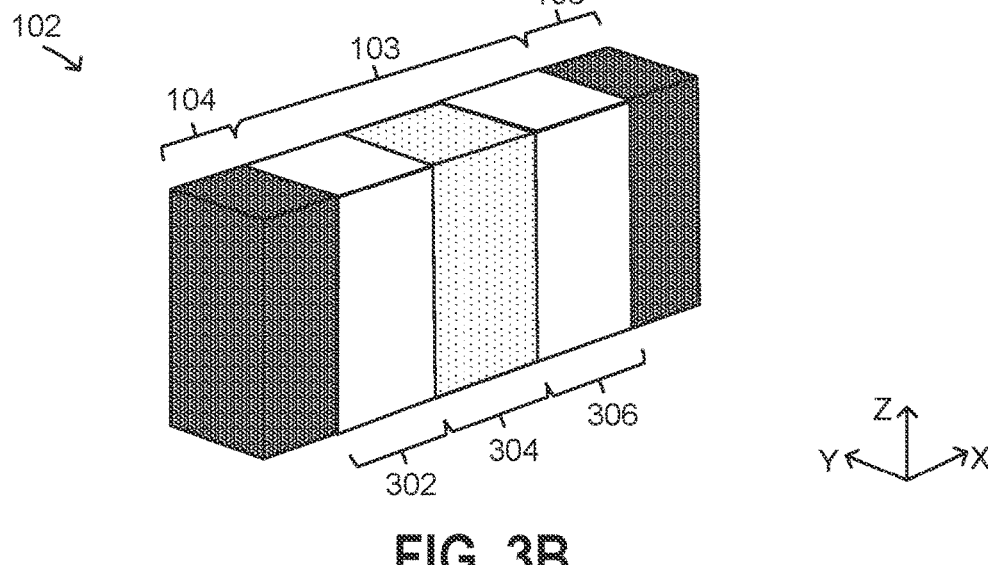
FIG. 3B is a schematic diagram illustrating a perspective view of an example fin structure shown in FIG. 3A in accordance with some embodiments.

FIGS. 3A-3B illustrate an example FinFET device 300. FIG. 3A is schematic diagram illustrating a cross-sectional view of the FinFET device 300 along the first horizontal direction. FIG. 3B is a perspective view of the fin structure 102 of the FinFET device 300 shown in FIG. 3A. The FinFET device 300 is a close variation of the FinFET device 200. Thus, similar components such as the substrate 101, a fin structure 102, and a gate structure 110 will not be repeated here unless otherwise indicated.

In the illustrated example, the fin structure 102 includes a segmented channel region 103. The segmented channel region 103 includes at least three channel segments (i.e., the first channel segment 302, second channel segment 304, and third channel segment 306) sequentially arranged in the first horizontal direction. At least one of the channel segments 302, 304, and 306 includes a channel barrier material/dopant.

In some embodiments, the channel region 103 includes Si as the base semiconductor material, and the second channel segment 304 is doped with a channel barrier material/dopant. In some embodiments, the channel barrier material/dopant includes at least one of $SiO_2$, SiGe, $Ga_2O_3$, $TiO_2$, InP, GaAs, GaP, CdSe, TaON, $WO_3$, $ZrO_2$, ZnS, SiC, $SrTiO_3$, TaN, TiN, $HfO_2$, SiGeC, InGaAs, or a combination thereof. In some embodiments, the channel barrier material/dopant has a work function higher than the work function of Si by 0.1 eV to 1.0 eV. In some embodiments, the second channel segment 304 has an energy barrier height of 0.1 eV to 1.0 eV. In some embodiments, the channel barrier dopant in the second channel segment 304 has a doping concentration of $10^2$-$10^{20}$ atoms/cm$^3$. In some embodiments, the first and third channel segments 302 and 306 are substantially free from the channel barrier material included in the second channel segment 304.

In some embodiments, the first, second, and third channel segments 302, 304, and 306 may each have a length (L1) from about 1 nm to 50 nm, from 1 nm to 45 nm, from 1 nm to 35 nm, from 1 nm to 25 nm, from 1 nm to 20 nm, from 1 nm to 15 nm, from 1 nm to 10 nm, from 1 nm to 5 nm, or from 1 nm to 3 nm. In some embodiments, the total length of the channel region including a channel barrier material is from about 1 nm to 50 nm, from 1 nm to 45 nm, from 1 nm to 35 nm, from 1 nm to 25 nm, from 1 nm to 20 nm, from 1 nm to 15 nm, from 1 nm to 10 nm, from 1 nm to 5 nm, or from 1 nm to 3 nm.

In some embodiments, the second channel segment 304 includes a first channel barrier material, the first and third channel segments 302 and 306 include a second channel barrier material, and the first channel barrier material is different from the second channel barrier material. In some embodiments, the first, second, and third channel segments 302, 304 and 306 include the same channel barrier material, the second channel segment 304 has a first doping concentration, the first and third channel segments 302 and 306 have a second doping concentration, and the first doping concentration is higher than the second doping concentration by at least one order, at least 2 orders, at least 5 orders, at least 10 orders, or at least 20 orders.

In some embodiments, the second channel segment 304 has a first energy barrier height, the first and third channel segments 302 and 306 have a second energy barrier height, and the first energy barrier height is higher than the second energy barrier height by at least 1 time, at least 2 times, or at least 3 times.

Figure 4A:
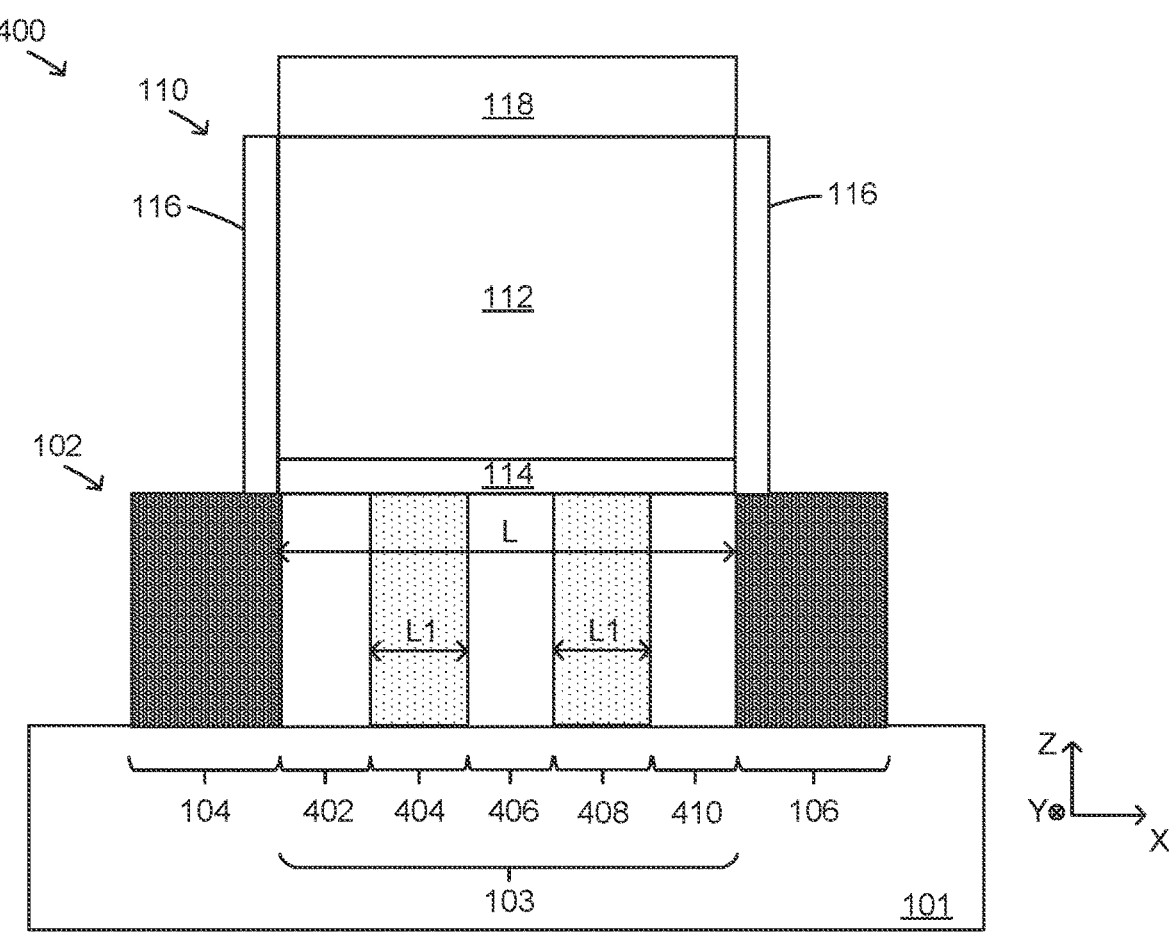
FIG. 4A is schematic diagram illustrating a cross-sectional view of yet another example FinFET device along a first horizontal direction in accordance with some embodiments.
Figure 4B:
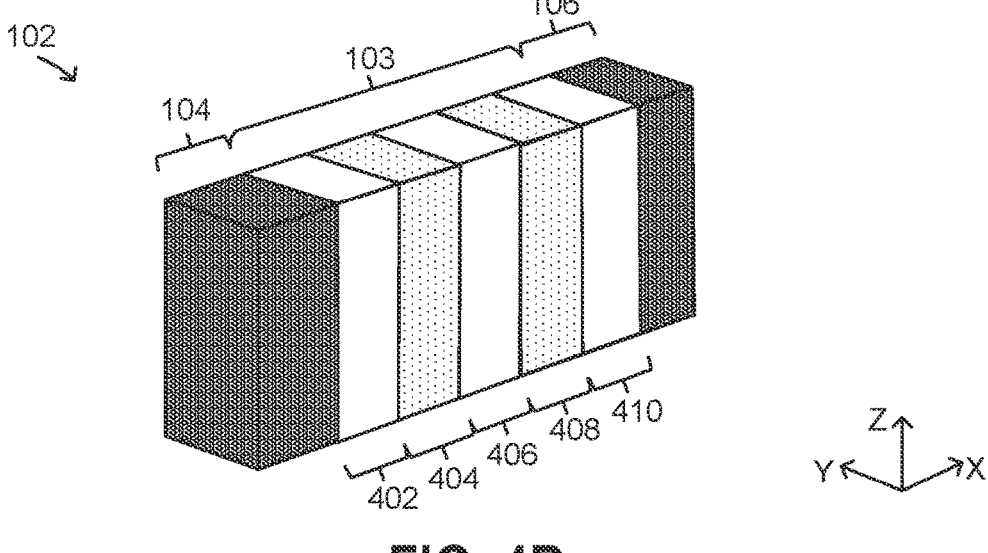
FIG. 4B is a schematic diagram illustrating a perspective view of an example fin structure shown in FIG. 4A in accordance with some embodiments.

FIGS. 4A-4B illustrate an example FinFET device 400. FIG. 4A is schematic diagram illustrating a cross-sectional view of the FinFET device 400 along the first horizontal direction. FIG. 4B is a perspective view of the fin structure 102 of the FinFET device 400 shown in FIG. 4A. The FinFET device 400 is a close variation of the FinFET devices 100 and 200. Thus, similar components such as the substrate 101, a fin structure 102, and a gate structure 110 will not be repeated here unless otherwise indicated.

In the illustrated example, the fin structure 102 includes a segmented channel region 103. The segmented channel region 103 includes at least five channel segments (i.e., the first channel segment 402, second channel segment 404, and third channel segment 406, the fourth channel segment 408, and the fifth channel segment 410) sequentially arranged in the first horizontal direction. The second and fourth channel segments 404 and 408 are separated by the third channel segment 406. At least one of the channel segments 402, 404, 406, 408, and 410 includes a channel barrier material/dopant.

In some embodiments, the channel region 103 includes Si as the base semiconductor material, and the second channel segment 404 as well as the fourth channel segment 408 are doped with a channel barrier material/dopant. In some embodiments, the second channel segment 404 and the fourth channel segment 408 include the same channel barrier material/dopant. In some embodiments, the channel barrier material/dopant includes at least one of $SiO_2$, SiGe, $Ga_2O_3$, $TiO_2$, InP, GaAs, GaP, CdSe, TaON, $WO_3$, $ZrO_2$, ZnS, SiC, $SrTiO_3$, TaN, TiN, $HfO_2$, SiGeC, InGaAs, or a combination thereof. In some embodiments, the channel barrier material/dopant has a work function higher than the work function of Si by 0.1 eV to 1.0 eV. In some embodiments, the second channel segment 404 and the fourth channel segment 408 have an energy barrier height of 0.1 eV to 1.0 eV. In some embodiments, the channel barrier dopant in the second channel segment 404 and the fourth channel segment 408 have a doping concentration of $10^2$-$10^{20}$ atoms/cm$^3$. In some embodiments, the first, third, and fifth channel segments 402, 406, and 410 are substantially free from the channel barrier material included in the second channel segment 404 and the fourth channel segment 408.

In some embodiments, the channel segments 402, 404, 406, 408, and 410 may each have a length (L1) from about 1 nm to 50 nm, from 1 nm to 45 nm, from 1 nm to 35 nm, from 1 nm to 25 nm, from 1 nm to 20 nm, from 1 nm to 15 nm, from 1 nm to 10 nm, from 1 nm to 5 nm, or from 1 nm to 3 nm. In some embodiments, the total length of the channel region including a channel barrier material is from about 1 nm to 50 nm, from 1 nm to 45 nm, from 1 nm to 35 nm, from 1 nm to 25 nm, from 1 nm to 20 nm, from 1 nm to 15 nm, from 1 nm to 10 nm, from 1 nm to 5 nm, or from 1 nm to 3 nm.

In some embodiments, the second channel segment 404 and the fourth channel segment 408 each include a first channel barrier material, the first, third, and fifth channel segments 402, 406, and 410 each include a second channel barrier material, and the first channel barrier material is different from the second channel barrier material. In some embodiments, the first, second, and third channel segments 402, 404 and 406 include the same channel barrier material, the second channel segment 404 and the fourth channel segment 408 have a first doping concentration, the first, third, and fifth channel segments 402, 406, and 410 have a second doping concentration, and the first doping concentration is higher than the second doping concentration by at least one order, at least 2 orders, at least 5 orders, at least 10 orders, or at least 20 orders.

In some embodiments, the first, third, and fifth channel segments 402, 406, and 410 include a third channel barrier material different from the first and second channel barrier materials. In some embodiments, the first, third, and fifth channel segments 402, 406, and 410 include the channel barrier dopant of the second channel segment 404 and/or the fourth channel segment 408, the first, third, and fifth channel segments 402, 406, and 410 include a third doping concentration of the channel barrier dopant, and the third doping concentration is different from the first and second doing concentrations.

In some embodiments, the second channel segment 404 and the fourth channel segment 408 have a first energy barrier height, the first, third, and fifth channel segments 402, 406, and 410 have a second energy barrier height, and the first energy barrier height is higher than the second energy barrier height by at least 1 time, at least 2 times, or at least 3 times. In some embodiments, the first, third, and fifth channel segments 402, 406, and 410 each have a third energy barrier height, and the first energy barrier height is higher than the third energy barrier height by at least 1 time, at least 2 times, or at least 3 times. In some embodiments, the second energy barrier height is higher than the third energy barrier height by at least 1 time, at least 2 times, or at least 3 times.

Figure 5A:
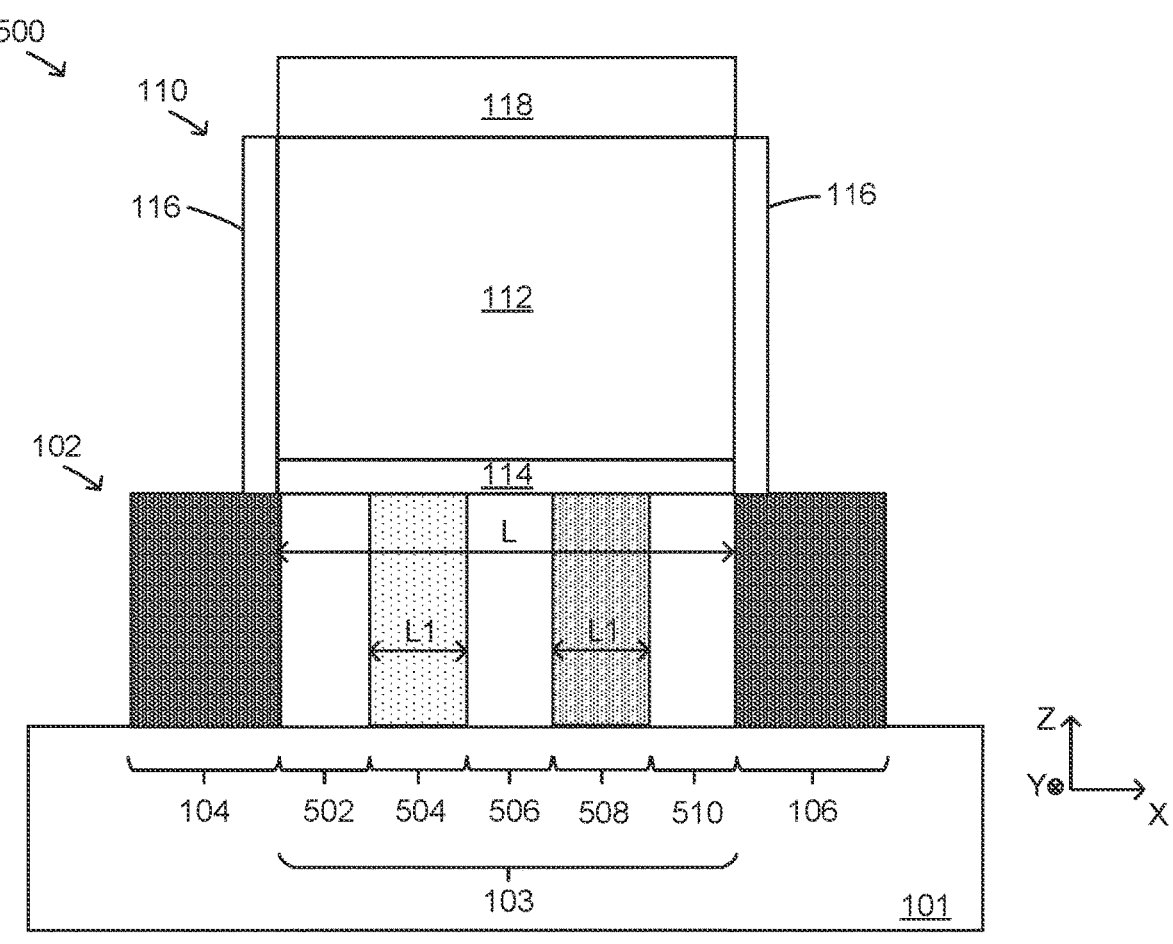
FIG. 5A is schematic diagram illustrating a cross-sectional view of a further example FinFET device along a first horizontal direction in accordance with some embodiments.
Figure 5B:
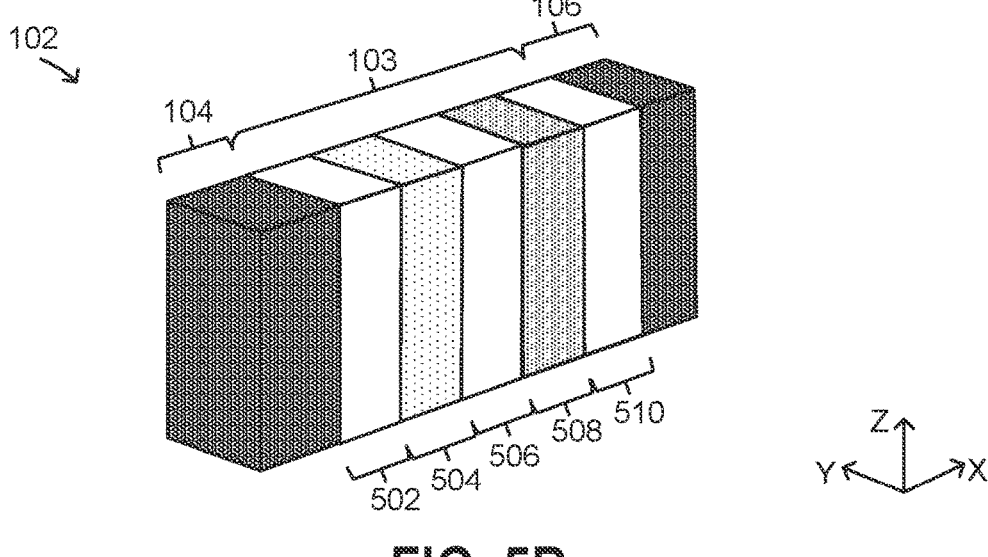
FIG. 5B is a schematic diagram illustrating a perspective view of an example fin structure shown in FIG. 5A in accordance with some embodiments.

FIGS. 5A-5B illustrate an example FinFET device 500. FIG. 5A is schematic diagram illustrating a cross-sectional view of the FinFET device 500 along the first horizontal direction. FIG. 5B is a perspective view of the fin structure 102 of the FinFET device 500 shown in FIG. 5A. The FinFET device 500 is a close variation of the FinFET device 400.

In the illustrated example, the fin structure 102 includes a segmented channel region 103. The segmented channel region 103 includes at least five channel segments (i.e., the first channel segment 502, second channel segment 504, and third channel segment 506, the fourth channel segment 508, and the fifth channel segment 510) sequentially arranged in the first horizontal direction. The second and fourth channel segments 504 and 508 are separated by the third channel segment 506.

In some embodiments, the second channel segment 504 includes a first channel barrier material, the fourth channel segment 508 includes a second channel barrier material, and the first channel barrier material is different from the second channel barrier material. In some embodiments, the second and fourth channel segments 504 and 508 include the same channel barrier dopant, the second channel segment 504 has a first doping concentration, the fourth channel segment 508 has a second doping concentration, and the first doping concentration is different from the second doping concentration.

In some embodiments, the second channel segment 504 has a first energy barrier height, the fourth channel segment 508 has a second energy barrier height, and the first energy barrier height is higher than the second energy barrier height by at least 1 order, or at least 2 orders, or at least 3 orders, or at least 4 orders, or at least 5 orders.

In some embodiments, the first, third, and fifth channel segments 502, 506, and 510 have a third energy barrier height, and the first energy barrier height is higher than the second energy barrier height by at least 1 time, at least 2 times, or at least 3 times.

Figure 6A:
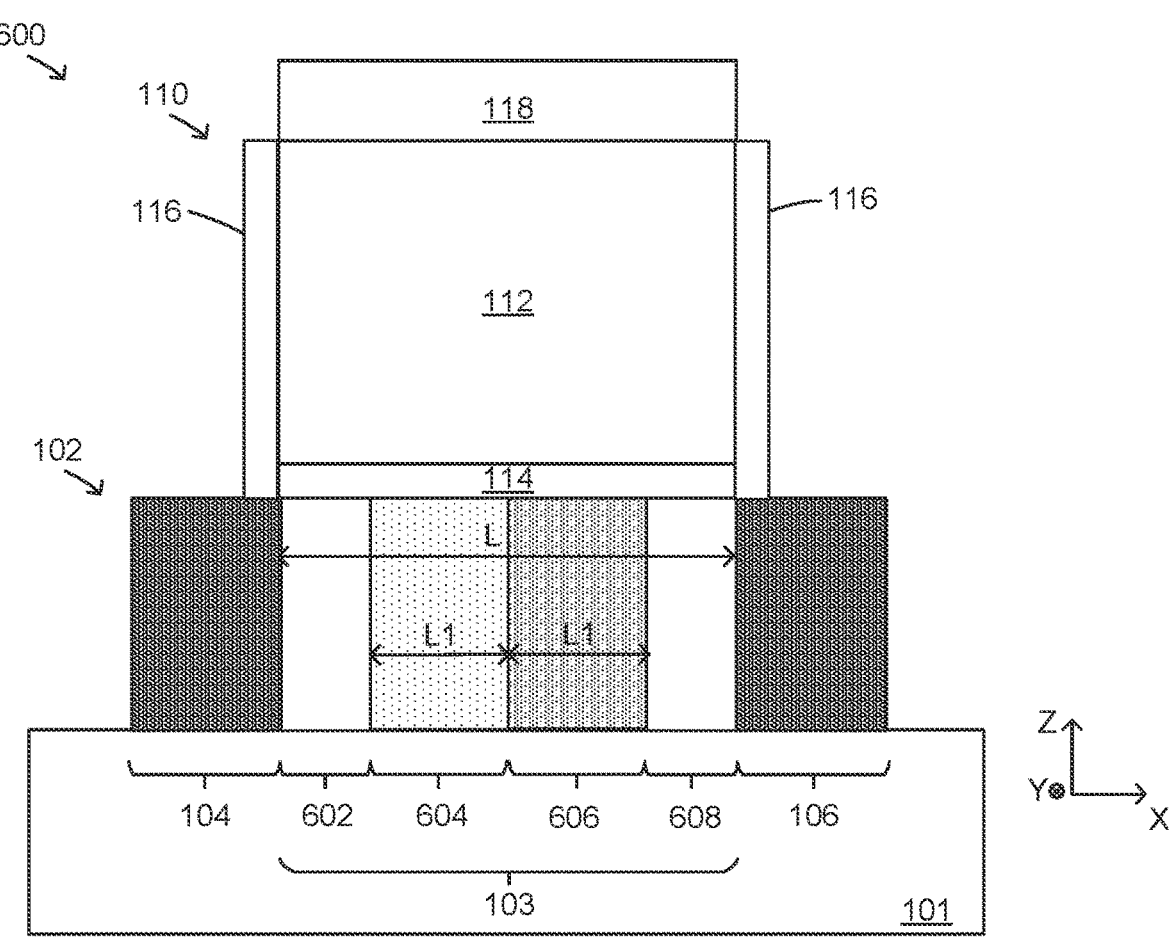
FIG. 6A is schematic diagram illustrating a cross-sectional view of another example FinFET device along a first horizontal direction in accordance with some embodiments.
Figure 6B:
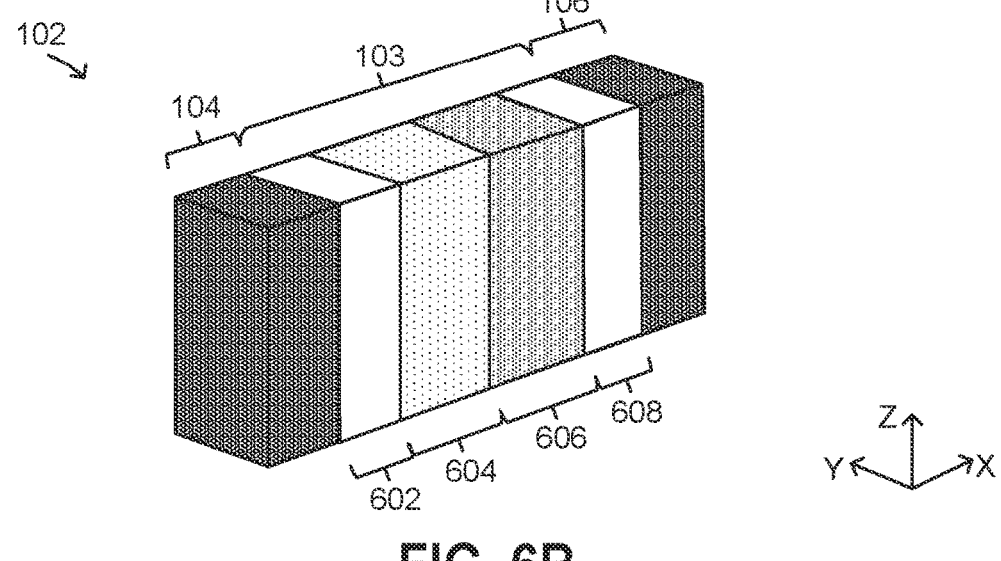
FIG. 6B is a schematic diagram illustrating a perspective view of an example fin structure shown in FIG. 6A in accordance with some embodiments.

FIGS. 6A-6B illustrate an example FinFET device 600. FIG. 6A is schematic diagram illustrating a cross-sectional view of the FinFET device 600 along the first horizontal direction. FIG. 6B is a perspective view of the fin structure 102 of the FinFET device 600 shown in FIG. 6A. The FinFET device 600 is a close variation of the FinFET device 500.

In the illustrated example, the fin structure 102 includes a segmented channel region 103. The segmented channel region 103 includes at least four channel segments (i.e., the first channel segment 602, second channel segment 604, and third channel segment 606, and the fourth channel segment 608) sequentially arranged in the first horizontal direction. The second and third channel segments 604 and 606 are directly connected and are separated from the S/D regions 104 and 106.

In some embodiments, the second channel segment 604 includes a first channel barrier material, the third channel segment 606 includes a second channel barrier material, and the first channel barrier material is different from the second channel barrier material. In some embodiments, the second and third channel segments 604 and 606 include the same channel barrier dopant, the second channel segment 604 has a first doping concentration, the third channel segment 606 has a second doping concentration, and the first doping concentration is different from the second doping concentration.

In some embodiments, the second channel segment 604 has a first energy barrier height, the third channel segment 606 has a second energy barrier height, and the first energy barrier height is higher than the second energy barrier height by at least 1 order, or at least 2 orders, or at least 3 orders, or at least 4 orders, or at least 5 orders.

In some embodiments, the first and fourth channel segments 602 and 608 have a third energy barrier height, and the first energy barrier height is higher than the second energy barrier height by at least 1 time, at least 2 times, or at least 3 times.

It should be noted the examples described above with references FIGS. 2A-6B are for illustrative purposes only, and other variations and modifications of the segmented channel region 103 are also within the scope of the present disclosure. For example, more than 5 channel segments may be included in the segmented channel region 103, and more than 3 different channel barrier materials or more than three different doping concentrations of the channel barrier dopant are also possible. The position and arrangement of the channel segments including a channel barrier material in the segmented channel region 103 may also be varied in other embodiments.

It is understood that although FIGS. 2A-6B discussed above only show a single FinFET device, a plurality of similar FinFET devices may be fabricated on a single wafer or on the same chip. For example, a complementary metal oxide semiconductor (CMOS) device includes both n-FET devices and p-FET devices. Both the n-FET devices and the p-FET devices can be fabricated using the process flow discussed below. In an embodiment, a work function of the gate of an n-FET device is closer to a conduction band edge of the FinFET device, and a work function of the gate of a p-FET device is closer to a valence band edge of the FinFET device.

Figure 7:
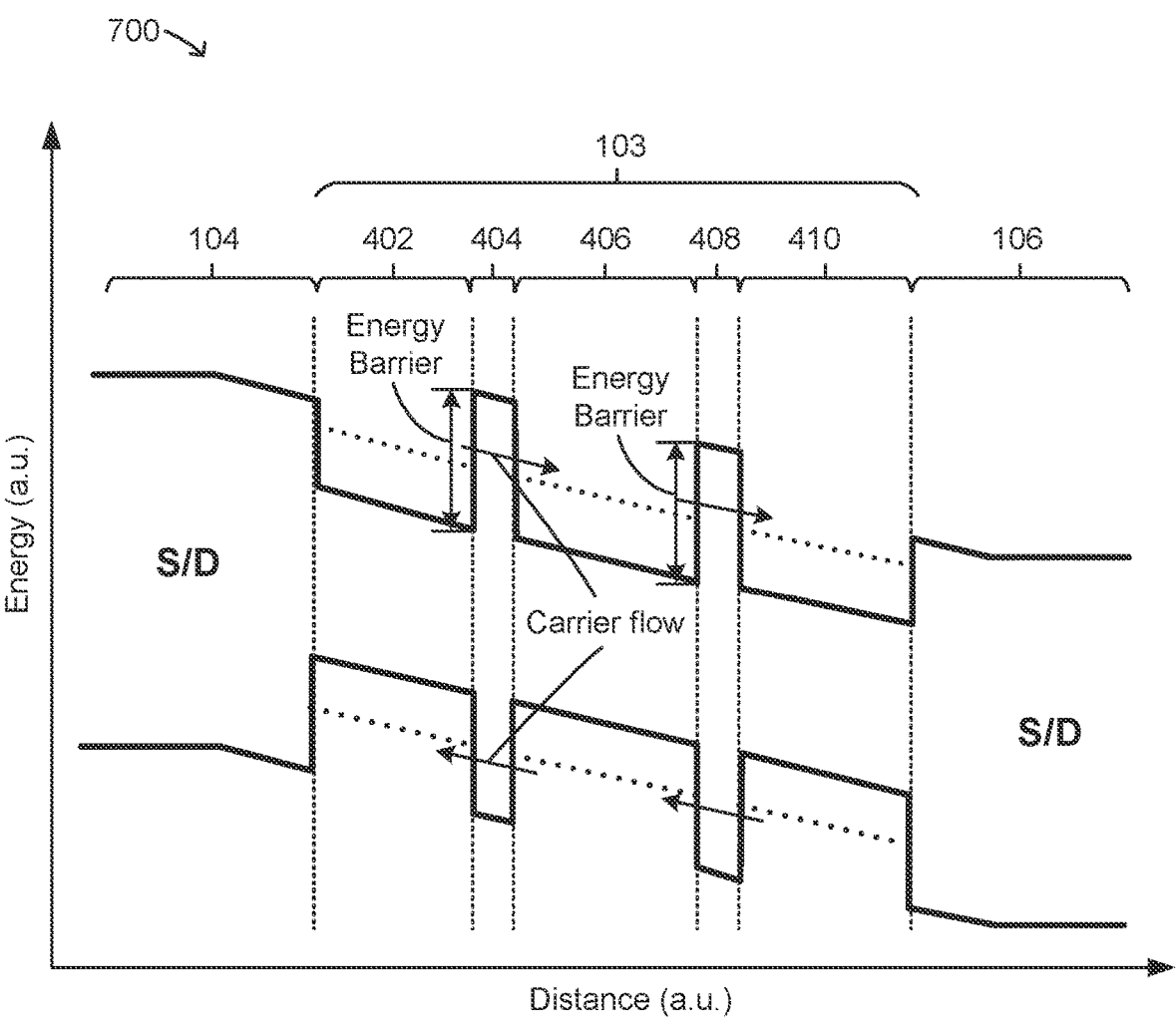
FIG. 7 is a schematic diagram illustrating an example of an energy band diagram of the FinFET device of FIG. 4A in accordance with some embodiments.

FIG. 7 is a schematic diagram illustrating an example of an energy band diagram 700 of the FinFET device 400 in accordance with some embodiments. In the illustrated example, the carriers (electrons or holes) may flow from one S/D region 104/106 to the other S/D region 106/104 through the segmented channel region 103 even when the FinFET device is at the "OFF" state (i.e., when the FinFET device 400 is not activated for operation, or when the voltage across the FinFET device 400 is below the threshold voltage (Vt) without the channel barrier material), due to the punch-through leakage. However, because the second and fourth channel regions 404 and 408 both include a channel barrier material/dopant, two energy barriers are generated respectively in the second and fourth channel regions 404 and 408 along the path of the carrier flow. Due to the energy barriers, the punch-through current leakage can be significantly reduced or minimized at the "OFF" state of the FinFET device 400. It should be noted that the example energy profile of FIG. 7 corresponding to FinFET device 400 is for illustrative purposes only, and other energy profiles are also possible in accordance with other example FinFET devices within the scope of the present disclosure.

Example Fabrication Process Flow

FIG. 8 is a flowchart diagram illustrating an example method 800 for fabricating a semiconductor device 900 in accordance with some embodiments. FIGS. 9A-9F are schematic diagrams illustrating perspective views or cross-sectional views of the example semiconductor device 900, at various stages, fabricated using the example method 800 shown in FIG. 8 in accordance with some embodiments. FIGS. 9A-9E are perspective views, FIG. 9F is a cross-sectional view taken along the line X-X' of FIG. 9E, and FIG. 9G-9H are perspective views taken along the line Y-Y' of FIG. 9E. It should be noted that variations of the FinFET devices such the FinFET devices 100, 200, 300, 400, 500, 600 and other possible variations and modifications may also be fabricated using method 800 or any operations thereof.

As shown in FIG. 8, the method 800 may include operations 802, 804, 806, and 808. Additional operations may be performed. Also, it should be understood that the sequence of the various operations discussed with reference to FIG. 8 is provided for illustrative purposes, and as such, other embodiments may utilize different sequences. These various sequences of operations are to be included within the scope of embodiments.

At 802, at least one continuous channel segment is formed on a substrate extending in a first horizontal direction. In some embodiments, a mandrel process is employed to form the continuous channel segments. In some embodiments, a mandrel layer is first formed on a substrate. In some embodiments, an epitaxial growth process is performed to form the at least one continuous channel segment. Alternatively, an ion implantation process may be performed to form the continuous channel segment.

Figure 9A:
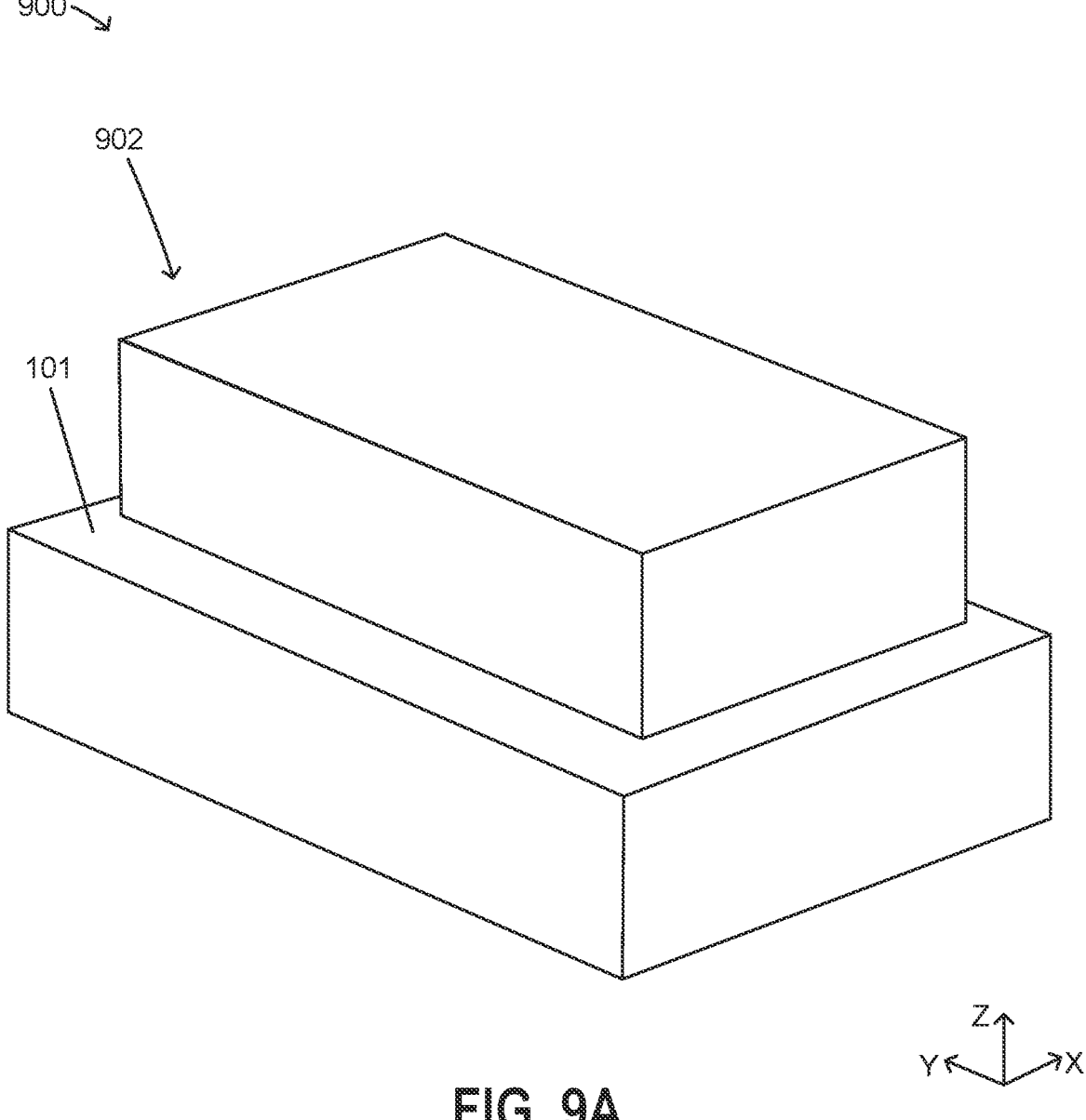
FIGS. 9A-9E are schematic diagrams illustrating perspective views of an example semiconductor device, at various stages, fabricated using the method shown in FIG. 8 in accordance with some embodiments.

In the illustrated example of FIG. 9A, a mandrel layer 902 is formed on a substrate 101. The mandrel layer 902 may be formed by depositing a base semiconductor material (e.g., Si) on the substrate 101 using a suitable deposition technique, such as physical vapor deposition (PVD), chemical vapor deposition (CVD), atomic layer deposition (ALD), or spin coating.

Multiple continuous channel segments may be formed by an epitaxial growth process, an implantation process, or a combination of both. As an example of an epitaxial growth process, the mandrel layer formed on the substrate is patterned and etched to form at least one trench extending along a first horizontal direction. The number of the trench may vary depending on the desired number of continuous channel segments. In some embodiments, one trench is formed. In some embodiments, two or more trenches are formed and parallelly spaced from each other.

As an example of the patterning and etching process to form the trench in the mandrel layer, a hard mask layer is deposited on the top surface of the mandrel layer. The hard mask may include silicon oxide or silicon nitride. A photoresist layer is then applied on the top surface of the hard mask layer. The photoresist layer is then exposed to light through a patterned mask, which contains the desired pattern. The exposed photoresist layer is then developed to selectively remove either the exposed or unexposed regions of the photoresist layer, depending on whether a positive or negative resist is used. Using the developed resist as a mask, a selective etching process is performed to transfer the pattern into the hard mask layer. The etching removes the hard mask material in the areas not protected by the photoresist and generates the desired trenches according to the desired pattern.

Figure 9B:
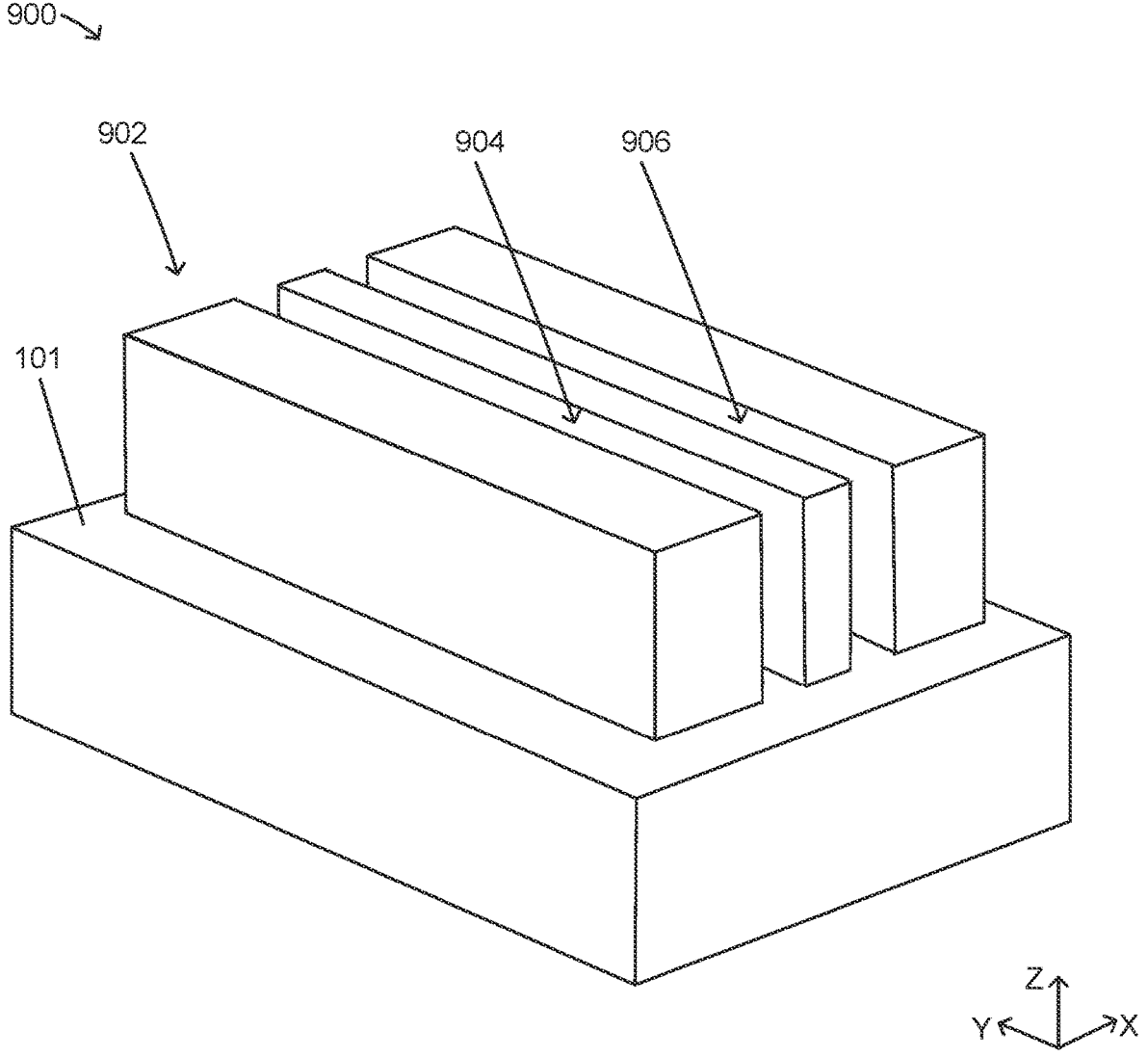

In the example of FIG. 9B, two trenches 904 and 906 are respectively formed and extending along the Y-direction. The two trenches 904 and 906 are parallelly spaced from each other by a portion of the mandrel layer 902 disposed therebetween. The two trenches 904 and 906 respectively correspond to the two to-be-generated continuous channel segments (shown in FIG. 9C).

After the trenches are formed, an epitaxial growth process is performed to form a continuous epitaxial or crystalline layer in the trench formed in the mandrel layer using suitable deposition techniques such as CVD, metal-organic CVD (MOCVD), PVD, hydride vapor phase epitaxy (HVPE), liquid phase epitaxy (LPE), molecular beam epitaxy (MBE), and so on. The epitaxial or crystalline layer formed in the trench includes a channel barrier material as described above.

Figure 9C:
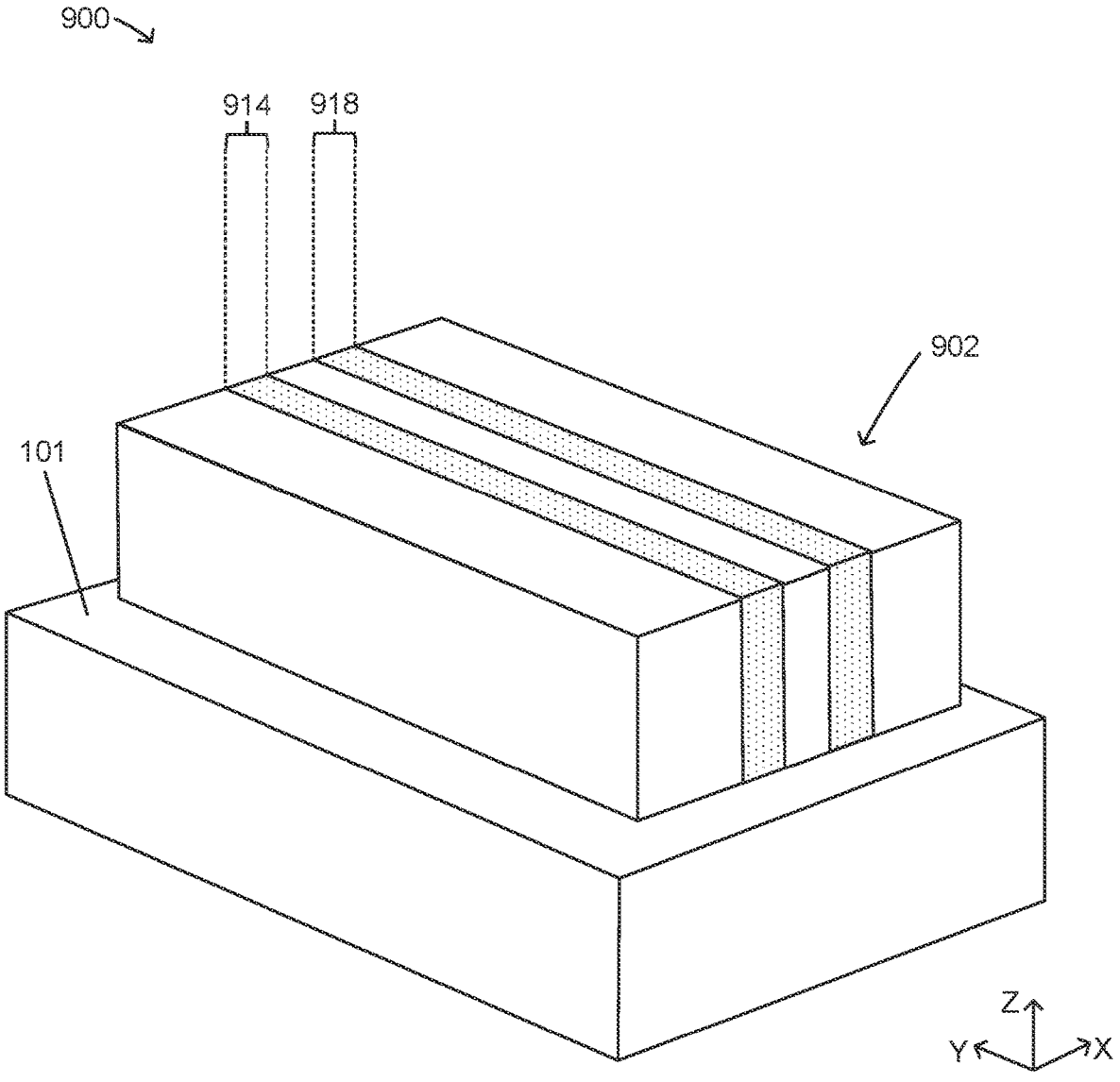

In the example of FIG. 9C, two continuous epitaxial layers are respectively grown in the trenches 904 and 906 to form the continuous channel segments 914 and 918. The continuous channel segments 914 and 918 extend in the Y-direction. In some embodiments, the continuous channel segments 914 and 918 include the same channel barrier material (e.g., SiGe, SiO$_2$, etc.). In some embodiments, the epitaxial layers of the continuous channel segments 914 and 918 respectively include two different channel barrier materials (e.g., SiGe included in the continuous epitaxial layer of the continuous channel segment 914, and SiO$_2$ included in the continuous epitaxial layer of the continuous channel segment 918). The dimension of each one of the channel segments 914 and 918 in the X-direction may be from 1 nm to 30 nm.

Alternatively, the multiple continuous channel segments may be formed by an implantation process to introduce a channel barrier dopant into selected regions of the mandrel layer corresponding to the desired continuous channel segments, without the need to generate a trench in the mandrel layer. As an example, a patterned mask is applied on the mandrel layer with the desired regions of the mandrel layer (i.e., the regions corresponding to the desired continuous channel segments) exposed. An ion implantation process is performed to introduce the desired channel barrier dopants into the exposed regions of the mandrel layer. The ions are accelerated and directed toward the exposed region of the mandrel layer, and the exposed regions of the mandrel layer are doped. The operational parameters of the implantation process (e.g., energy, dosage, diffusion temperature, diffusion time, etc.) can be controlled to achieve the desired doping concentration of the channel barrier dopants. In some embodiments, the implantation doping energy is from 0.7 eV to 54 eV. In some embodiments, the dosage of the implantation process is $10^2$ to $10^{20}$ atoms/cm$^3$. In some embodiments, the diffusion temperature is from $-150$ to $800$ degrees Celsius. In some embodiments, the diffusion time is from 5 seconds to 5 hours. In the example of FIG. 9C, the continuous channel segments 914 and 918 may be formed by the ion implantation process, and each one of the continuous channel segments 914 and 918 includes a channel barrier dopant. In some embodiments, the continuous channel segments 914 and 918 may be formed by introducing two different channel barrier dopants respectively into the corresponding regions of the mandrel layer 902. It should be noted that other doping techniques beyond ion implantation may also be used to form the continuous channel segment.

At 804, continuous S/D regions are formed in the mandrel layer in the first horizontal direction. The continuous S/D regions may be formed by heavily doping the corresponding regions of the mandrel layer using an ion implantation process or other suitable doping techniques. In some embodiments, n-type dopants such as As, P, or Sb are doped into the n-type S/D region for n-type FinFET, and p-type dopants such as B or In are doped into the p-type S/D regions. The doping concentration of the continuous S/D regions may be from $10^{19}$ to $10^{21}$ atoms/cm$^3$. It should be noted that the S/D regions may be formed before or after the formation of fin structures. The continuous S/D regions may also be formed before or after the formation of the gate structure described below.

Figure 9D:
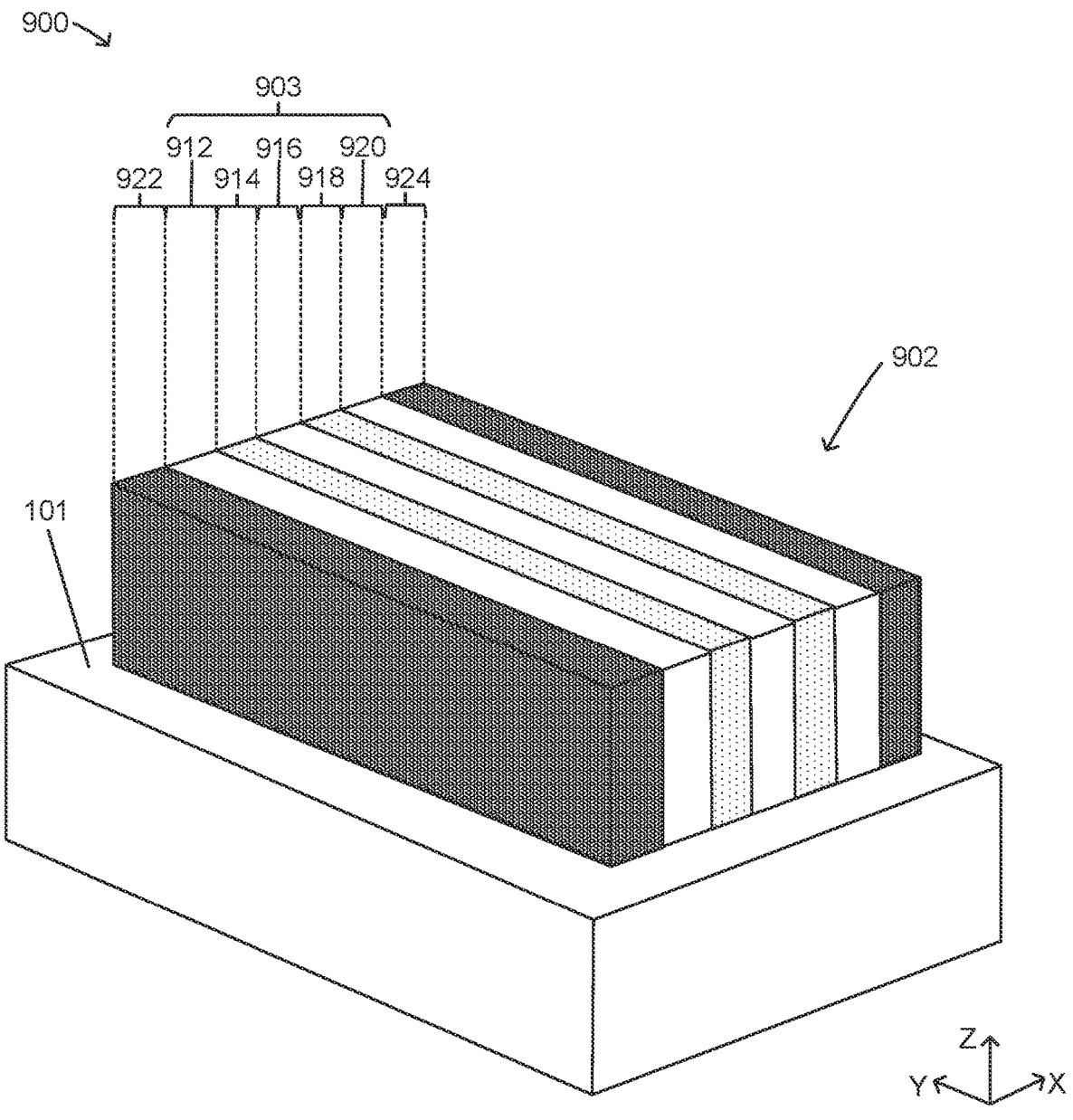
Figure 9E:
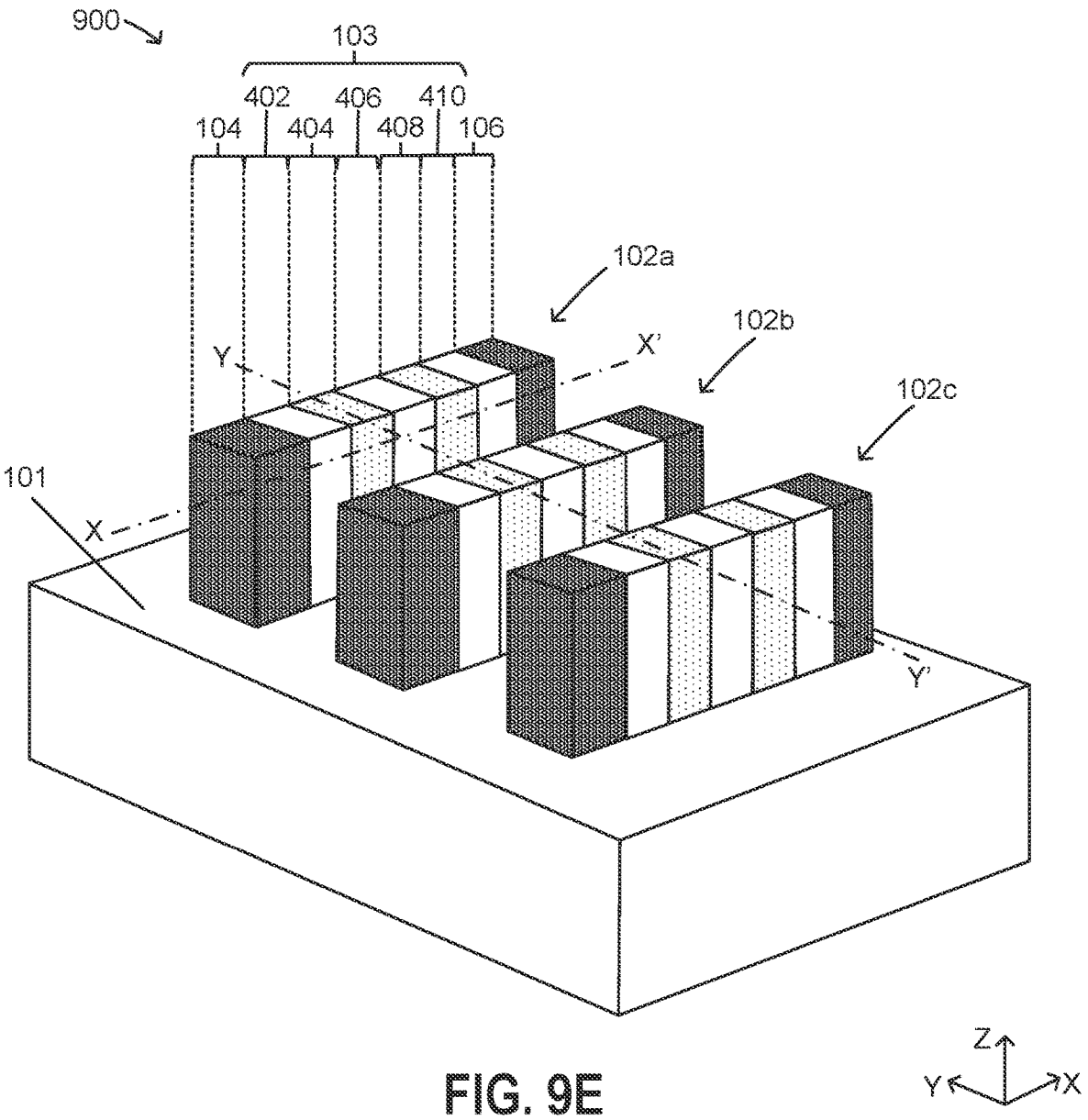
Figures 9F, 9G:
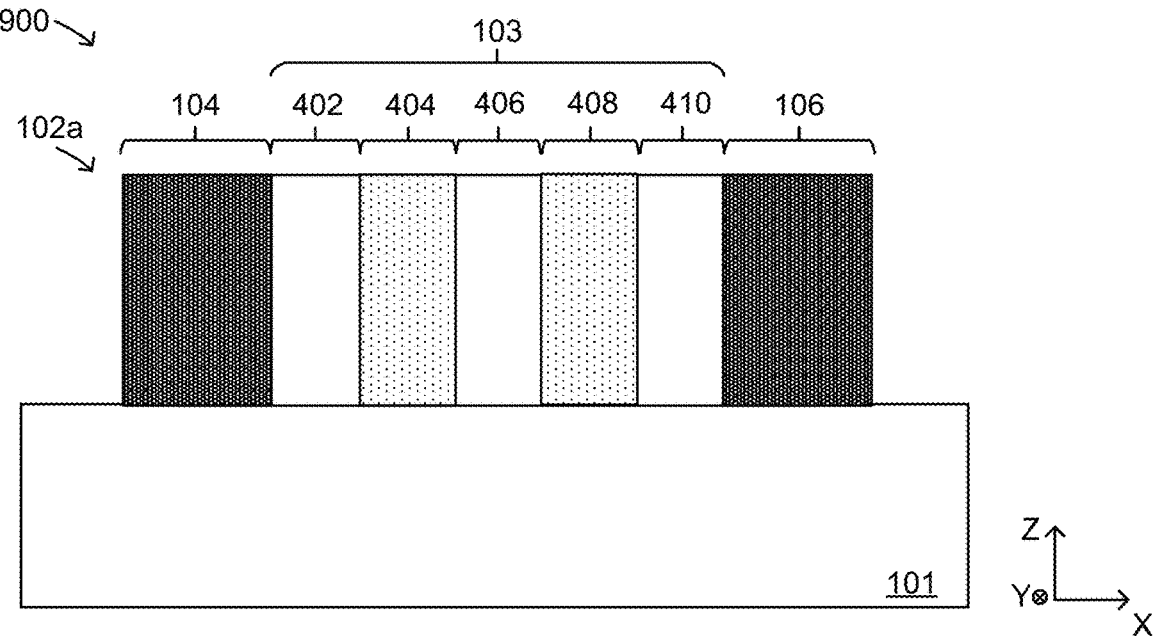
FIG. 9F is a schematic diagram illustrating a cross-sectional view of an example semiconductor device along a first horizontal direction, at a stage, fabricated using the method shown in FIG. 8 in accordance with some embodiments.
FIG. 9G-9H are schematic diagrams illustrating a cross-sectional view of an example semiconductor device along a second horizontal direction, at various stages, fabricated using the method shown in FIG. 8 in accordance with some embodiments.
Figure 9H:
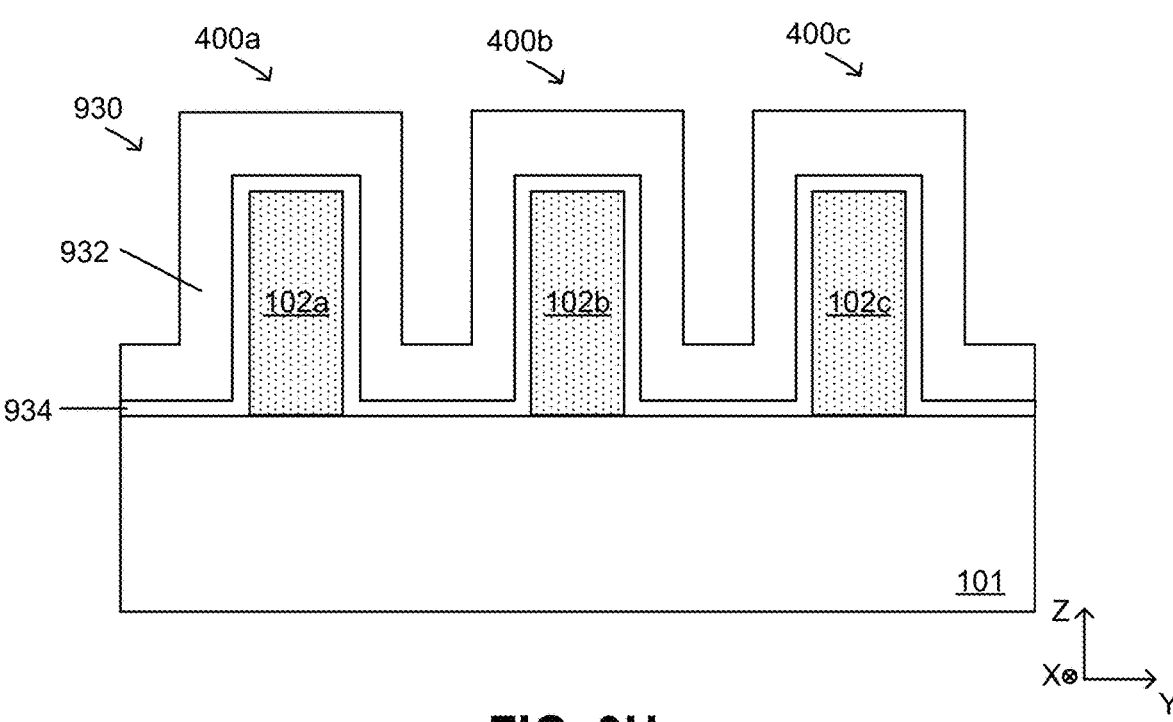

In the example of FIG. 9D, two continuous S/D regions 922 and 924 are formed and extending continuously along the Y-direction. The two continuous S/D regions 922 and 924 may be formed respectively on the two opposite sides of the continuous channel segments 914/918 along the X-direction, such that the continuous channel segments 914/918 are arranged between the two continuous S/D regions 922 and 924. The two continuous S/D regions 922 and 924 accordingly define the continuous channel region 903 positioned therebetween. Further, five continuous channel segments 912, 914, 916, 918, and 920 are sequentially formed in the continuous channel region 903. Each one of the continuous channel segments 912, 914, 916, 918, and 920 extend continuously in the Y-direction. The continuous channel segment 914 is positioned between the two continuous channel segments 912 and 916, and the continuous channel segment 918 is positioned between the two continuous channel segments 916 and 920.

In some embodiments, additional ion implantation processes may be performed to introduce one or more channel barrier dopants into one or more of the continuous channel segments 912, 914, 916, 918, and 920, before or after the two S/D regions 922 and 924 are formed. For example, the continuous channel segments 912, 916, and 920 may be doped with a channel barrier dopant that is the same as of different from the channel barrier material/dopant included in the continuous channel segments 914 and/or 918.

In some embodiments, an ion implantation process is performed to introduce a channel barrier dopant into each one of the continuous channel segments 912, 914, 916, 918, and 920. The operational parameters of the ion implantation process may be controlled to achieve different doping concentrations of the channel barrier dopant across the continuous channel segments 912, 914, 916, 918, and 920 in the X-direction. In some embodiments, one or more patterned masks may be used in the ion implantation process to achieve different doping concentrations, and a doping profile across the entire continuous channel region 903 may be achieved.

At 806, at least one fin structure is formed on the substrate in a second horizontal direction perpendicular to the first horizontal direction. In the example of FIGS. 9D-9E and 9F-9G, the mandrel layer 902 is patterned and etched to form three fin structures 102a, 102b, and 102c (collectively as fin structure 102). Each fin structure 102 extends along the X-direction (perpendicular to the Y-direction). The portions of the mandrel layer on the two sides of a fin structure 102 or between every two adjacent fin structures are removed in the patterning and etching process. The multiple fin structures 102 are parallelly positioned and aligned along the Y-direction. As shown in FIG. 9E, each fin structure 102 includes a segmented channel region 103 that further includes five channel segments 402, 404, 406, 408, and 410. The channel region 103 of each fin structure 102 corresponds to the continuous channel region 903 of FIG. 9D, and each one of the five channel segments 402, 404, 406, 408, and 410 is a corresponding portion of the continuous channel segments 912, 914, 916, 918, and 920 (shown in FIG. 9D). The multiple fin structures 102 may be used to form a single FinFET device or alternatively for separate FinFET devices in subsequent operations. It should be noted that the number of fin structures 102 formed on the substrate 101 may vary, depending on design requirements.

At 808, a continuous gate structure extending in the first horizontal direction is formed and disposed on the channel segments of the fin structures. In some embodiments, a continuous gate dielectric layer is formed on the channel segments, a continuous gate metal layer is formed on the continuous gate dielectric layer, and continuous gate spacers are formed along two sides of the continuous gate metal layer. In the example shown in FIG. 9G, a continuous gate dielectric layer 934 is formed and disposed on the fin structures 102a, 102b, and 102c and covers the channel region 103 of each fin structure 102. A continuous gate metal layer 932 is formed and disposed on the continuous gate dielectric layer 934 to form the continuous gate structure 930. In some embodiments, continuous gate spacers (not shown) are also formed along the two sides of the continuous gate metal layer 932. Accordingly, FinFET devices 400a, 400b, and 400c (collectively as FinFET devices 400) are formed. It should be noted that the number of FinFET devices 400 may vary, depending on the number of the fin structures 102 formed in operation 806. In some embodiments, the multiple FinFET devices 400 may be included in the semiconductor device 900. In some embodiments, the multiple FinFET devices 400 are electrically isolated (i.e., by performing a gate cut process to cut off the continuous gate structure 930) and included in different semiconductor devices in an active region on the substrate 101. One or more shallow trench isolation (STI) structures (not shown) may be formed to isolate adjacent FinFET devices (i.e., between two adjacent fin structures 102) in the semiconductor device 900 formed on the substrate 101.

In some embodiments, the S/D regions for each fin structure may be formed after the continuous gate structure is formed. For example, the continuous gate spacers may be formed and used as a patterned mask, and an ion implantation process is performed to dope the exposed regions under the patterned mask to form the corresponding S/D regions for each fin structure.

Various other components may be formed during the fabrication of the FinFET devices 400 and the semiconductor device 900 described above. Such components include but are not limited to gate metal contacts, S/D electrodes, silicide contacts, and so on. These components may be formed by one or more suitable semiconductor fabrication processes known in the art.

Summary

In accordance with some aspects of the disclosure, field effect transistor (FET) devices having a heterogeneous/segmented channel region are provided. In one example, a fin-like field effect transistor (FinFET) device includes a substrate, a fin structure disposed on the substrate and extending in a horizontal direction, a segmented channel region formed in the fin structure and extending in the horizontal direction, two source/drain (S/D) regions formed in the fin structure and separated by the segmented channel region, and a gate structure formed on the fin structure and wrapping around the segmented channel region. The segmented channel region further includes multiple channel segments sequentially arranged in the segmented channel region and extending in the horizontal direction, and the multiple channel segments include a first channel segment and a second channel segment. The first channel segment includes a first channel barrier material and has a first energy barrier, and the first energy barrier is at least 0.1 electron volts (eV) in a carrier flow path between the two S/D regions when the FinFET device is not activated for operation.

In another example, a fin-like field effect transistor (FinFET) device includes a substrate, a fin structure disposed on the substrate and extending in a horizontal direction, a segmented channel region formed in the fin structure and extending in the horizontal direction, two source/drain (S/D) regions formed in the fin structure and separated by the segmented channel region, and a gate structure formed on the fin structure and wrapping around the segmented channel region. The segmented channel region further includes a first channel segment, a second channel segment, a third channel segment, a fourth channel segment, and a fifth channel segment sequentially arranged in the horizontal direction, the first channel segment is positioned between the first and third channel segments, and the fourth channel segment is positioned between the third and fifth channel segments. The second channel segment includes a first channel barrier material and has a first energy barrier, the fourth channel segment includes a second channel barrier material and has a second energy barrier, and the first and second energy barriers are at least 0.1 electron volts (eV) in a carrier flow path between the two S/D regions when the FinFET device is not activated for operation.

In accordance with some aspects of the disclosure, methods for fabricating a FET device are provided. In one example, a method includes forming at least one continuous channel segment in a mandrel layer disposed on a substrate. The at least one continuous channel segment extends in a first horizontal direction and includes a channel barrier material. The method further includes forming two continuous S/D regions in the mandrel layer. The two continuous S/D regions extend in the first horizontal direction, the at least one continuous channel segment is positioned between the two continuous S/D regions, and the at least one continuous channel segment is not connected to at least one of the two continuous S/D regions. The method further includes forming at least one fin structure in the mandrel layer. The at least one fin structure extends in a second horizontal direction perpendicular to the first horizontal direction and further includes two S/D regions respectively corresponding to the two continuous S/D regions and a channel region positioned between the two S/D regions. The channel region comprises a channel segment, and the channel segment is a corresponding portion of the at least one continuous channel segment. The method further includes forming a gate structure in the first horizontal direction. The gate structure is disposed on the at least one fin structure and wraps around the channel region of the at least one fin structure. The channel segment has an energy barrier of at least 0.1 electron volts (eV) in a carrier flow path between the two S/D regions when the FinFET device is not activated for operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-like field effect transistor (FinFET) device, comprising:
    a substrate;

a fin structure disposed on the substrate, the fin structure extending in a horizontal direction;

a segmented channel region formed in the fin structure and extending in the horizontal direction;

two source/drain (S/D) regions formed in the fin structure and separated by the segmented channel region; and a gate structure formed on the fin structure and wrapping around the segmented channel region, wherein the segmented channel region further comprises a plurality of channel segments sequentially arranged in the segmented channel region and extending in the horizontal direction, the plurality of channel segments comprising a first channel segment and a second channel segment, wherein the first channel segment comprises a first channel barrier material and has a first energy barrier, and the first energy barrier is at least 0.1 electron volts (eV) in a carrier flow path between the two S/D regions when the FinFET device is not activated for operation.

2. The FinFET device of claim 1, wherein the segmented channel region comprises a base semiconductor material having a first work function, the first channel barrier material has a second work function, and the second work function is higher than the first work function by at least 0.1 eV.

3. The FinFET device of claim 2, wherein the base semiconductor material is Si, and the first channel barrier material is selected from the group consisting of SiGe, $SiO_2$, $Ga_2O_3$, $TiO_2$, InP, GaAs, GaP, CdSe, TaON, $WO_3$, $ZrO_2$, ZnS, SiC, $SrTiO_3$, or a combination thereof.

4. The FinFET device of claim 3, wherein the first channel barrier material is SiGe, and the first channel segment has a concentration of Ge from 5% to 40%, based on weight.

5. The FinFET device of claim 1, wherein the first energy barrier of the first channel segment is from 0.1 eV to 1.0 eV.

6. The FinFET device of claim 1, wherein the first channel barrier material is an epitaxially grown layer formed in the first channel segment.

7. The FinFET device of claim 1, wherein the first channel barrier material is a channel barrier dopant distributed in the first channel segment, and the channel barrier dopant has a doping concentration of the dopant from $10^{18}$ to $10^{20}$ atoms/$cm^3$.

8. The FinFET device of claim 1, wherein the segmented channel region has a channel length from 5 nm to 50 nm in the horizontal direction, and each one of the first and second channel segments has a segment length from 1 nm to 30 nm in the horizontal direction.

9. The FinFET device of claim 1, wherein the second channel segment comprises a second channel barrier material and has a second energy barrier in the carrier flow path between the two S/D regions, and the first energy barrier is higher than the second energy barrier by at least 1 time.

10. The FinFET device of claim 9, wherein the first channel barrier material is a first channel barrier dopant having a first doping concentration in the first channel segment, the second channel barrier material is the first channel barrier dopant having a second doping concentration in the second channel segment, wherein the first doping concentration is higher than the second doping concentration by at least one order.

11. The FinFET device of claim 1, wherein the first channel segment is connected to one of the two S/D regions.

12. The FinFET device of claim 1, wherein the first channel segment is not connected to the two S/D regions.

13. The FinFET device of claim 1, wherein the first and second channel segments are connected.

14. The FinFET device of claim 1, wherein the first and second channel segments are not connected.

15. The FinFET device of claim 1, wherein the plurality of channel segments further comprises a third channel segment, wherein the first channel segment is positioned between the second channel segment and the third channel segment.

16. A FinFET device, comprising:

a substrate;

a fin structure disposed on the substrate, the fin structure extending in a horizontal direction;

a segmented channel region formed in the fin structure and extending in the horizontal direction;

two source/drain (S/D) regions formed in the fin structure and separated by the segmented channel region; and a gate structure formed on the fin structure and wrapping around the segmented channel region, wherein the segmented channel region further comprises a first channel segment, a second channel segment, a third channel segment, a fourth channel segment, and a fifth channel segment sequentially arranged in the horizontal direction, the second channel segment is positioned between the first and third channel segments, and the fourth channel segment is positioned between the third and fifth channel segments, wherein the second channel segment comprises a first channel barrier material and has a first energy barrier, the fourth channel segment comprises a second channel barrier material and has a second energy barrier, and the first and second energy barriers are at least 0.1 electron volts (eV) in a carrier flow path between the two S/D regions when the FinFET device is not activated for operation.

17. The FinFET device of claim 16, wherein the first and second channel barrier materials are the same, and the first and second energy barriers are substantially the same.

18. The FinFET device of claim 16, wherein the first and second channel barrier materials are different, and the first energy barrier is higher than the second energy barrier by at least 1 time.

19. A method for fabricating a FinFET device, the method comprising:

forming at least one continuous channel segment in a mandrel layer disposed on a substrate, the at least one continuous channel segment extending in a first horizontal direction and comprising a channel barrier material;

forming two continuous S/D regions in the mandrel layer, wherein the two continuous S/D regions extend in the first horizontal direction, the channel segment is positioned between the two continuous S/D regions, and the continuous channel segment is not connected to at least one of the two continuous S/D regions;

forming at least one fin structure in the mandrel layer, the fin structure extending in a second horizontal direction perpendicular to the first horizontal direction and comprising:

two S/D regions respectively corresponding to the two continuous S/D regions; and a channel region positioned between the two S/D regions, the channel region comprising a channel segment corresponding to the continuous channel segment, forming a gate structure in the first horizontal direction, wherein the gate structure is disposed on the at least one fin structure and wraps around the channel region of the fin structure, whereby a FinFET device is formed, wherein the channel segment has an energy barrier of at least 0.1 electron volts (eV) in a carrier flow path between the two S/D regions when the FinFET device is not activated for operation.

20. The method of claim 19, wherein forming the continuous channel segment further comprises:

forming a trench in the mandrel layer extending in the first horizontal direction; and growing an epitaxial layer of the channel barrier material in the trench.

* * * * *